United States Patent
Grannen et al.

(10) Patent No.: US 7,345,410 B2
(45) Date of Patent: Mar. 18, 2008

(54) TEMPERATURE COMPENSATION OF FILM BULK ACOUSTIC RESONATOR DEVICES

(75) Inventors: Kevin J. Grannen, Thornton, CO (US); John Choy, Westminster, CO (US); Carrie A. Rogers, Fort Collins, CO (US)

(73) Assignee: Agilent Technologies, Inc., Santa Clara, CA (US)

(*) Notice: Subject to any disclaimer, the term of this patent is extended or adjusted under 35 U.S.C. 154(b) by 0 days.

(21) Appl. No.: 11/386,372

(22) Filed: Mar. 22, 2006

(65) Prior Publication Data
US 2007/0222336 A1    Sep. 27, 2007

(51) Int. Cl.
*H01L 41/047* (2006.01)
(52) U.S. Cl. .................................. 310/364; 310/363

(58) Field of Classification Search .............. 310/363, 310/364
See application file for complete search history.

(56) References Cited

U.S. PATENT DOCUMENTS

| 5,956,292 A | * | 9/1999 | Bernstein ................ 367/140 |
| 2006/0035471 A1 | * | 2/2006 | Hill et al. ................ 438/758 |

FOREIGN PATENT DOCUMENTS

| JP | 58-137317 | * | 8/1983 |
| JP | 58-156220 | * | 9/1983 |
| JP | 11-58730 | * | 3/1999 |
| RU | 2066856 | * | 9/1996 |

\* cited by examiner

*Primary Examiner*—Thomas M. Dougherty

(57) ABSTRACT

A resonator. The resonator includes a bottom electrode overlaying at least part of a substrate, a composite structure overlaying at least part of the bottom electrode, and a top electrode overlaying at least part of the composite structure. The composite structure comprises a piezoelectric layer and a compensation layer, and the compensation layer includes silicon dioxide combined with boron.

13 Claims, 16 Drawing Sheets

TEMPERATURE COMPENSATION OF FILM BULK ACOUSTIC RESONATOR DEVICES

REFERENCE TO RELATED U.S. PATENTS

The subject matter of the instant Application is related to that of the following U.S. patents: (1) U.S. Pat. No. 5,587,620 by Ruby et al., entitled "Tunable Thin Film Acoustic Resonators and Method for Making the Same", issued 24 Dec. 1996, and assigned to Agilent Technologies, Inc., (2) U.S. Pat. No. 5,873,153 by Ruby et al., entitled "Method of Making Tunable Thin Film Acoustic Resonators", issued 23 Feb. 1999, and assigned to Agilent Technologies, Inc., and (3) U.S. Pat. No. 6,060,818 by Ruby et al., entitled "SBAR Structures and Method of Fabrication of SBAR.FBAR Film Processing Techniques for the Manufacturing of SBAR/BAR Filters", issued 9 May 2000, and assigned to Agilent Technologies, Inc. These Patents describe basic techniques for fabricating tunable thin film acoustic resonators, which techniques include components of the representative embodiments described below. Accordingly, each of the above-referenced U.S. patents is incorporated by reference in its entirety herein.

BACKGROUND

Numerous modern electronic devices from the simple wrist watch to the more sophisticated computer servers depend upon the generation of one or more clock or oscillator signals. To meet the needs of various applications, the signals generated should be accurate and stable. In addition, the operational frequencies of the generated signals should not significantly deviate with changes in temperature from the design frequency.

Essentially all cell phones, computers, microwave ovens, and numerous other electronic products use a quartz crystal resonator to generate a reference signal at a pre-selected frequency which is typically around 20 MHz. The gates in these crystal-controlled oscillators are "clocked" or switched at the pre-selected frequency using the reference signal. Any and all "time references" are generated from this quartz resonator-oscillator. Depending upon the specific application, the oscillator may need to have a frequency drift over the product's full operational temperature range of approximately +/−2 ppm. If this level of frequency control is necessary, the quartz resonator may need to be fabricated in an expensive hermetic ceramic package with a metal lid that is arc-welded around the perimeter. In applications such as cell phones, laptop computers, and other portable devices, this type of package may be larger than desirable. Also, as this crystal's resonant frequency is often approximately 20 MHz, the signal from the oscillator must often be multiplied upwards by other power consuming electronics with resultant harmonics generally suppressed by only approximately 5 dB relative to the fundamental frequency.

Oscillators can also be constructed using other types of resonators such as standard L-C (inductor-capacitive) resonators, thin film bulk acoustic resonators (FBARs), and the like. While such resonators are less expensive than quartz resonators their frequency drift characteristics are generally less than acceptable for the applications mentioned above, as well as for others. In particular, thin film bulk acoustic resonator devices are designed to resonate at a specific frequency which in one design is 1900 MHz. But, over a typical operating temperature range of −30° C. to +85° C., their resonating frequency can vary several MHz due to the frequency variation with temperature of the constituent materials. If the allowable frequency band for the device is narrow, the frequency shift with temperature may be so great as to shift the operating frequency of the device beyond the allowable frequency band.

To alleviate the problem of drift with temperature in FBARs, work has been done in developing compensation layers to reduce or eliminate the shift of resonant frequency with temperature. Several recent studies have shown the effectiveness of silicon dioxide layers deposited at various locations within the stack structure.

However, current FBAR processes utilize a sacrificial layer of phosphosilicate glass (8% phosphorus, 92% silicon dioxide). Subsequent layers of the device are deposited, sequentially, upon the phosphosilicate glass until the final structure is developed whereupon the phosphosilicate glass is etched away with hydrofluoric acid leaving a free-standing structure. Unfortunately, silicon dioxide is etched rapidly in hydrofluoric acid making silicon dioxide unsuitable as a temperature compensation layer with current FBAR fabrication processes.

SUMMARY

In representative embodiments, a resonator is disclosed. The resonator comprises a bottom electrode overlaying at least part of a substrate, a composite structure overlaying at least part of the bottom electrode, and a top electrode overlaying at least part of the composite structure. The composite structure comprises a piezoelectric layer and a compensation layer, and the compensation layer comprises silicon dioxide combined with boron.

In another representative embodiment, a method for fabricating a resonator on a substrate is disclosed. The method comprises creating a bottom electrode overlaying at least part of the substrate, creating a composite structure overlaying at least part of the bottom electrode, and creating a top electrode overlaying at least part of the composite structure. The method step creating the composite structure further comprises creating a piezoelectric layer and creating a compensation layer, and the compensation layer comprises silicon dioxide combined with boron.

In still another representative embodiment, a resonator is disclosed. The resonator comprises a bottom electrode overlaying at least part of a substrate, a piezoelectric layer overlaying at least part of the bottom electrode, and a top electrode overlaying at least part of the piezoelectric layer. The bottom electrode comprises a bottom under electrode layer, a compensation layer, and a bottom over electrode layer. The compensation layer comprises silicon dioxide combined with boron.

In still another representative embodiment, a resonator is disclosed. The resonator comprises a bottom electrode overlaying at least part of a substrate, a piezoelectric layer overlaying at least part of the bottom electrode, and a top electrode overlaying at least part of the piezoelectric layer. The top electrode comprises a top under electrode layer, a compensation layer, and a top over electrode layer. The compensation layer comprises silicon dioxide combined with boron.

Other aspects and advantages of the representative embodiments presented herein will become apparent from the following detailed description, taken in conjunction with the accompanying drawings.

BRIEF DESCRIPTION OF THE DRAWINGS

The accompanying drawings provide visual representations which will be used to more fully describe various representative embodiments and can be used by those skilled in the art to better understand them and their inherent advantages. In these drawings, like reference numerals identify corresponding elements.

DETAILED DESCRIPTION

Figure 1:
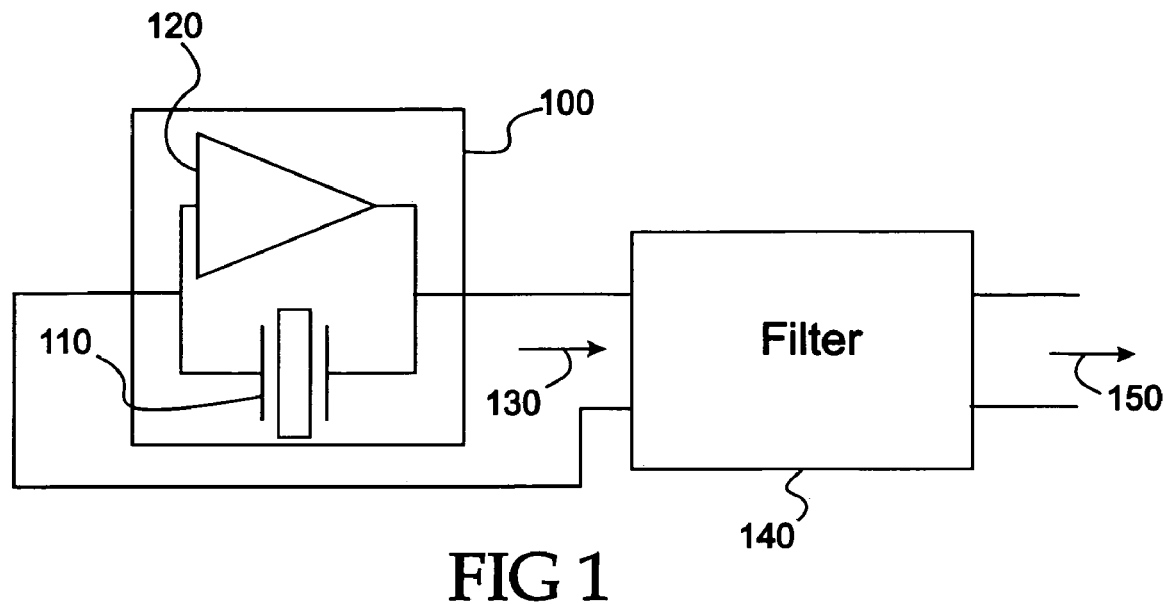
FIG. 1 is a drawing of a block diagram of an oscillator circuit as described in various representative embodiments.

As shown in the drawings for purposes of illustration, novel film bulk acoustic resonator devices having improved frequency drift vs. temperature characteristics are disclosed. Such resonators can be fabricated using integrated circuit techniques with resultant advantages in cost and size over quartz crystals which have been used in the past to obtain the better frequency drift characteristics relative to temperature.

In the following detailed description and in the several figures of the drawings, like elements are identified with like reference numerals. As used in the following discussion, the terms "overlaying" and "overlay" mean located or placed on top of. These terms are not meant to require, but they do permit, direct contact of the overlaying layer to an underlying layer. Further, these terms apply to both partially and totally covering an underlying layer by the overlaying layer.

FIG. 1 is a drawing of a block diagram of an oscillator circuit 100 as described in various representative embodiments. In FIG. 1, the oscillator circuit 100 comprises a resonator 110 and an amplifier 120. The output of the amplifier 120 is fed back to the input of the amplifier 120 via the resonator 110 which results in the oscillator circuit 100 generating oscillating signal 130. The result of filtering the oscillating signal 130 using a filter 140 is an output signal 150 at a frequency $f_0$ with the frequency $f_0$ being one of the resonant frequencies of the resonator 110.

Figure 2:
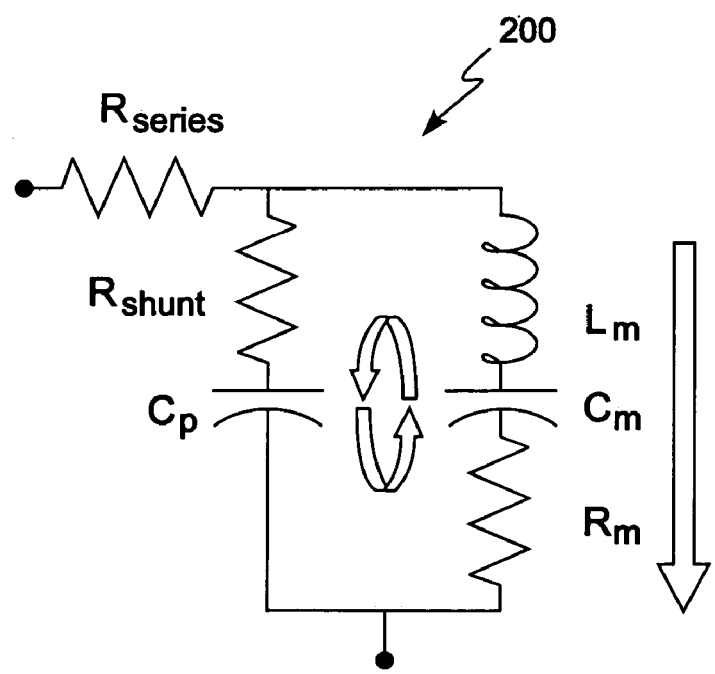
FIG. 2 is a drawing of an equivalent circuit for a thin film bulk acoustic resonator (FBAR).

FIG. 2 is a drawing of an equivalent circuit 200 for a thin film bulk acoustic resonator (FBAR). Thin film bulk acoustic resonators can be used in various representative embodiments herein due to the fact that their fabrication technology is compatible with that of integrated circuits resulting in relative advantages in cost, reliability, and size over other technologies. FIG. 2 is a modified Butterworth-Van Dyke model of a thin film bulk acoustic resonator. From this equivalent circuit 200 it can be observed that the thin film bulk acoustic resonator has two resonant frequencies. The first resonant frequency is referred to as series resonant frequency $f_{SER}$ which results from the series combination of inductor $L_M$ and capacitor $C_M$. The second resonant frequency is referred to as parallel resonant frequency $f_{PAR}$ which results from the parallel combination of shunt capacitor $C_P$ and the above series combination of inductor $L_M$ and capacitor $C_M$. The parallel resonant frequency $f_{PAR}$ is also referred to as the anti-resonant frequency $f_{PAR}$. Resistor $R_{SERIES}$ and shunt resistor $R_{SHUNT}$ represent non-ideal, resistive components in the structure. With appropriate choice of the characteristics of the filter 140 either the parallel resonant frequency $f_{PAR}$ or the series resonant frequency $f_{SER}$ can be selected in determining the frequency of the resultant output signal 150. In terms of the above and in a given implementation, the frequency $f_0$ could be either the parallel resonant frequency $f_{PAR}$ or the series resonant frequency $f_{SER}$ for the resonator 110. As a result in any given application, the filter 140 will need to filter the unwanted frequency to the level needed. Since for any given resonator, the parallel resonant frequency $f_{PAR}$ is less than the series resonant frequency $f_{SER}$, an appropriately designed low pass filter 140 could pass only the parallel frequency $f_{PAR}$.

Figure 3A:
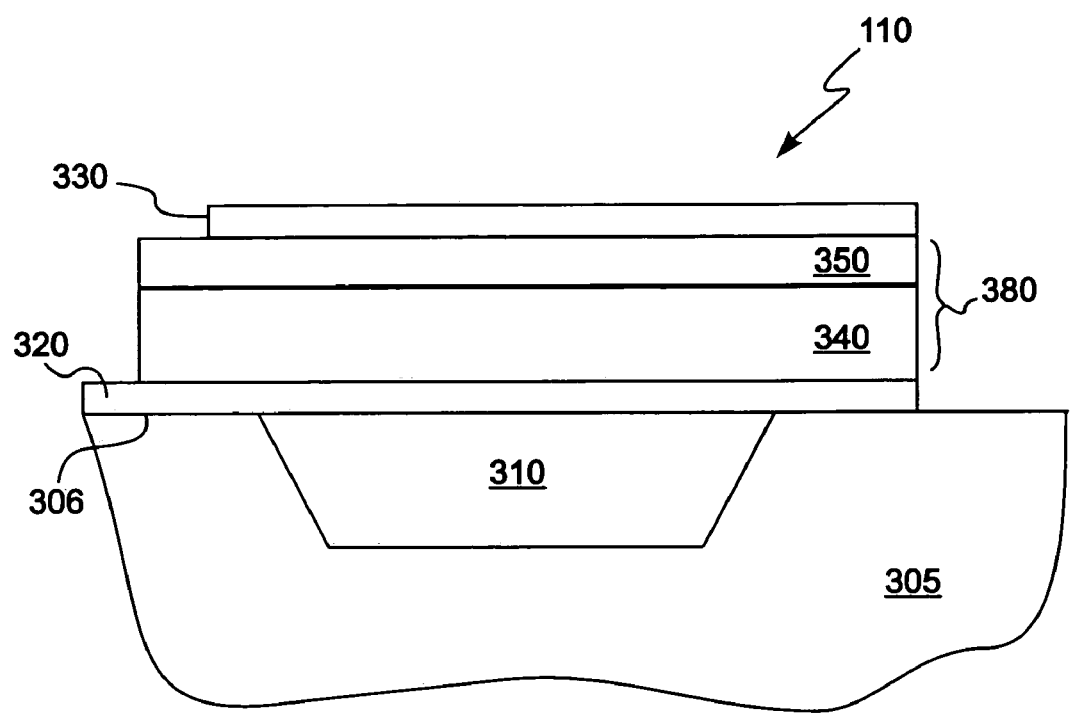
FIG. 3A is a drawing of the resonator as described in various representative embodiments.

FIG. 3A is a drawing of the resonator 110 as described in various representative embodiments. In FIG. 3A, the resonator 110 is shown in a side view and is fabricated using integrated circuit processing compatible procedures. In this example, the resonator 110 is a thin film bulk acoustic resonator (FBAR). The resonator 110 is fabricated on a substrate 305 which could be, for example, a silicon substrate 305, a silicon wafer 305, a ceramic substrate 305, or other appropriate material. The resonator 110 is fabricated above a cavity 310 which isolates the vibrating part of the resonator 110 from the substrate 305 in order to reduce the vibrational energy that would otherwise be dissipated in the substrate 305. The cavity 310 is created on the top surface 306 of the substrate 305. The resonator 110 is fabricated above and bridges the cavity 310. The resonator 110 includes a bottom electrode 320, a top electrode 330, and a composite structure 380 which in FIG. 3A comprises a first layer 340, also referred to herein as a piezoelectric layer 340, and a second layer 350, also referred to herein as a compensation layer 350. In the representative embodiment of FIG. 3A, the piezoelectric layer 340 lies on top of the bottom electrode 320, the compensation layer 350 lies on top of the piezoelectric layer 340, and the top electrode 330 lies on top of the compensation layer 350.

Figure 3B:
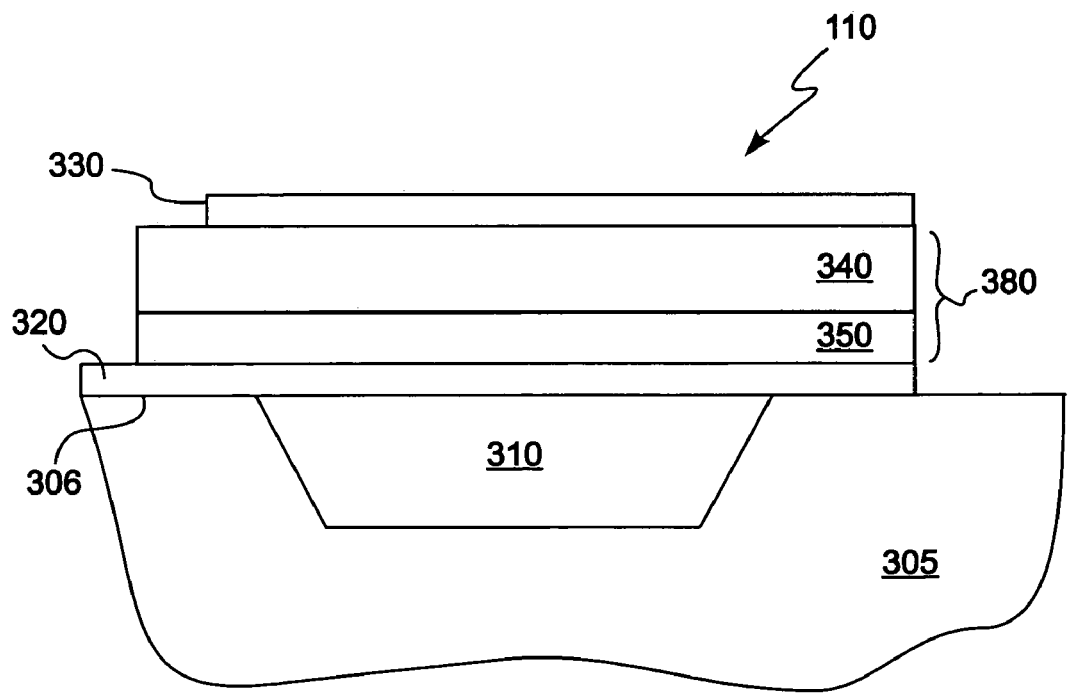
FIG. 3B is a drawing of another resonator as described in various representative embodiments.

FIG. 3B is a drawing of another resonator 110 as described in various representative embodiments. In FIG. 3B, the resonator 110 is shown in a side view and is fabricated using integrated circuit processing compatible procedures. In this example, the resonator 110 is a thin film bulk acoustic resonator (FBAR). The resonator 110 is fabricated on a substrate 305 which could be, for example, a silicon substrate 305, a silicon wafer 305, a ceramic substrate 305, or other appropriate material. Again, the resonator 110 is fabricated above the cavity 310. The cavity 310 is created on the top surface 306 of the substrate 305, and the resonator 110 is fabricated above and bridges the cavity 310. The resonator 110 includes the bottom electrode 320, the top electrode 330, and the composite structure 380 which in FIG. 3B comprises the piezoelectric layer 340 and the compensation layer 350. In the representative embodiment of FIG. 3B, the compensation layer 350 lies on top of the bottom electrode 320, the piezoelectric layer 340 lies on top of the compensation layer 350, and the top electrode 330 lies on top of the piezoelectric layer 340.

Figure 3C:
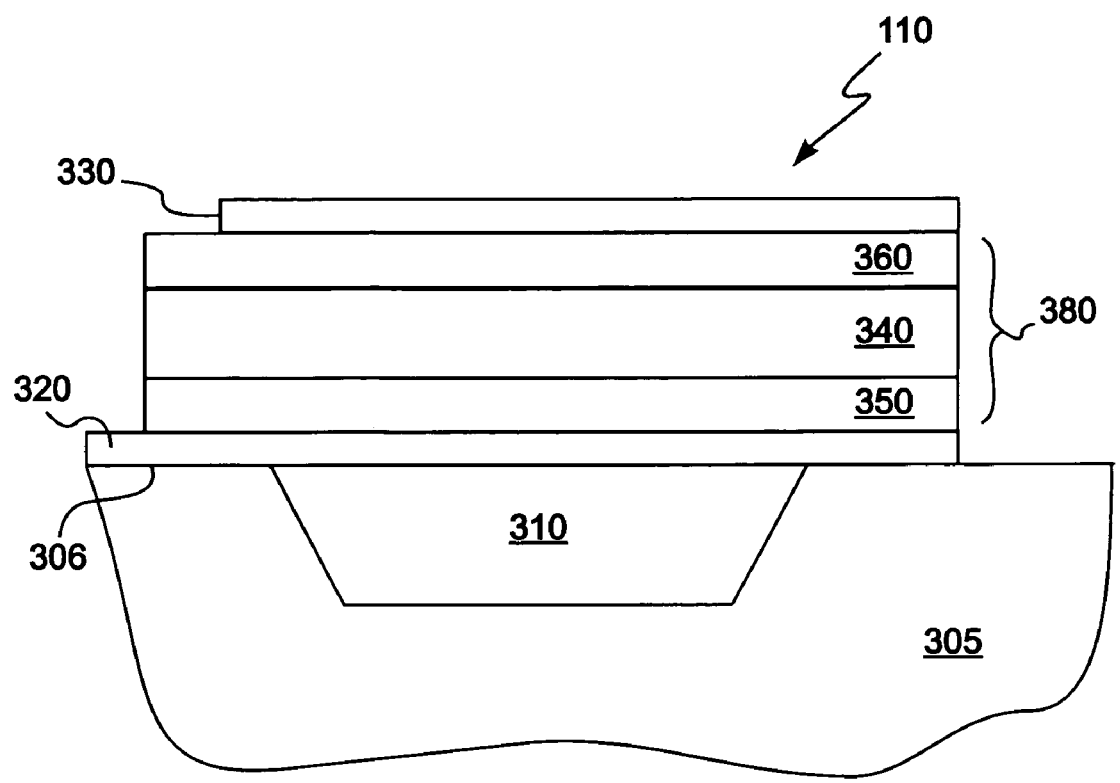
FIG. 3C is a drawing of still another resonator as described in various representative embodiments.

FIG. 3C is a drawing of still another resonator 110 as described in various representative embodiments. In FIG. 3C, the resonator 110 is shown in a side view and is fabricated using integrated circuit processing compatible procedures. In this example, the resonator 110 is a thin film bulk acoustic resonator (FBAR). The resonator 110 is fabricated on substrate 305 which could be, for example, a silicon substrate 305, a silicon wafer 305, a ceramic substrate 305, or other appropriate material. The resonator 110 is fabricated above the cavity 310. The cavity 310 is created on the top surface 306 of the substrate 305. The resonator 110 is fabricated above and bridges the cavity 310. The resonator 110 includes the bottom electrode 320, the top electrode 330, and the composite structure 380 which in FIG. 3C comprises the piezoelectric layer 340, the compensation layer 350, and a third layer 360, also referred to herein as an additional compensation layer 360. In the representative embodiment of FIG. 3C, the compensation layer 350 lies on top of the bottom electrode 320, the piezoelectric layer 340 lies on top of the compensation layer 350, the additional compensation layer 360 lies on top of the piezoelectric layer 340, and the top electrode 330 lies on top of the additional compensation layer 360.

In representative embodiments, the compensation layer 350 of FIGS. 3A-3C and the additional compensation layer 360 of FIG. 3C could comprise silicon dioxide combined with boron. This combination could be effected by ion implantation of silicon dioxide grown or deposited in the compensation layer 350 and/or in the additional compensation layer 360. The combination could also be effected by depositing borosilicate glass in the compensation layer 350 via a low temperature plasma-enhanced chemical vapor deposition (PECVD) process with a typical thickness ranging between 200 to 5,000 Angstroms and/or the additional compensation layer 360 via a low temperature plasma-enhanced chemical vapor deposition process with a typical thickness ranging between 200 to 5,000 Angstroms. In FIGS. 3A-3C the piezoelectric layer 340 could be fabricated using aluminum nitride (AlN) or any suitable piezoelectric material. In the case of aluminum nitride, the piezoelectric layer 340 could be created by vapor deposition at an appropriate processing step. The bottom and top electrodes 320, 330 could be, for example, molybdenum or any other suitable conductive material.

Various design considerations which include the addition of a mass load layer on top of the top electrode 330 (not shown in the figures), the thickness and location of the compensation layer 350, the presence/absence and the thickness of the additional compensation layer 360 if present, and the thickness of the piezoelectric layer 340 can be specified to adjust the resonant frequency $f_O$ and the frequency temperature coefficient $T_C$ of the resonator 110. In general, the greater the weight of the mass load layer, the lower will be the resonant frequency of the resonator. Also, the thicker the piezoelectric layer 340, the lower will be the resonant frequency of the resonator. In general, adding weight to the mass load layer will not appreciably change the frequency temperature coefficient as the mass load layer acts mostly as "dead weight" which does not change with a change in temperature. However, adding more mass loading decreases the resonant frequency $f_O$.

Figure 4A:
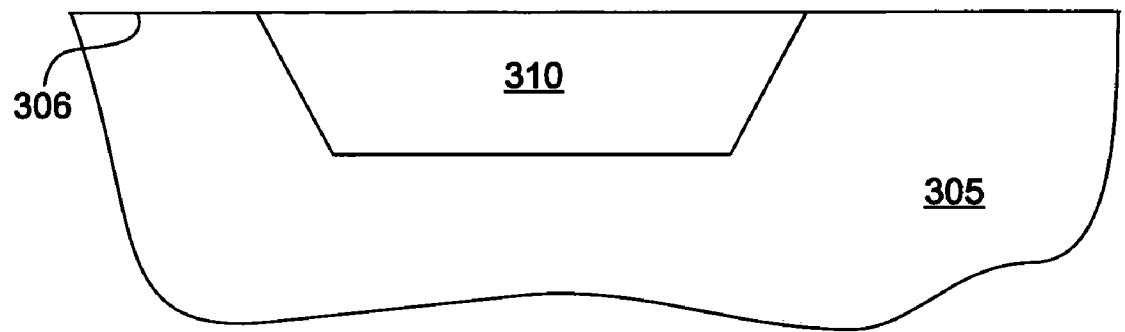
FIG. 4A is a drawing of a stage in the fabrication of the resonators of FIGS. 3A-3C.

FIG. 4A is a drawing of a stage in the fabrication of the resonators 110 of FIGS. 3A-3C. In FIG. 4A, the structure is shown in a side view and is fabricated using integrated circuit processing compatible procedures. In this example, the cavity 310 is formed in the substrate 305 by first using well known photolithographic technologies to coat the substrate 305 with a layer of photoresist which is then exposed using an appropriately patterned photomask and subsequently developing the photoresist layer to open a window in the photoresist through which the cavity 310 is then etched using well know etching technologies. The cavity 310 is then filled with a sacrificial material. The sacrificial material can be removed later and could be, for example, a phosphorus silica glass material which is deposited by chemical vapor deposition. Following these processes, the remaining photoresist is removed from the substrate 305 and the surface of the substrate 305 and filled cavity 310 are flattened and can be smoothed via one of a number of well known mechanical polishing processes and chemical etching processes.

Figure 4B:
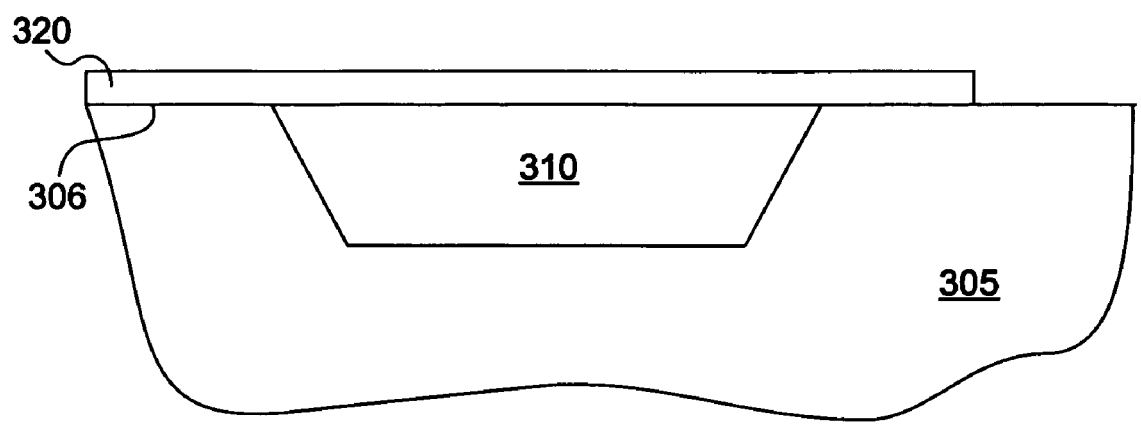
FIG. 4B is a drawing of another stage in the fabrication of the resonators of FIGS. 3A-3C.

FIG. 4B is a drawing of another stage in the fabrication of the resonators 110 of FIGS. 3A-3C. In FIG. 4B, the structure is shown in a side view. In this example following the fabrication of the structure of FIG. 4A, the bottom electrode 320 can be fabricated using well known technologies such as deposition and photolithography. As an example, a layer of molybdenum could be deposited onto the wafer 305 followed by the spinning of photoresist onto the wafer 305, the photoresist could be exposed to appropriately pattern the photoresist, the photoresist could be subsequently developed, and then the molybdenum could be etched to form the appropriately patterned bottom electrode 320.

Figure 5A:
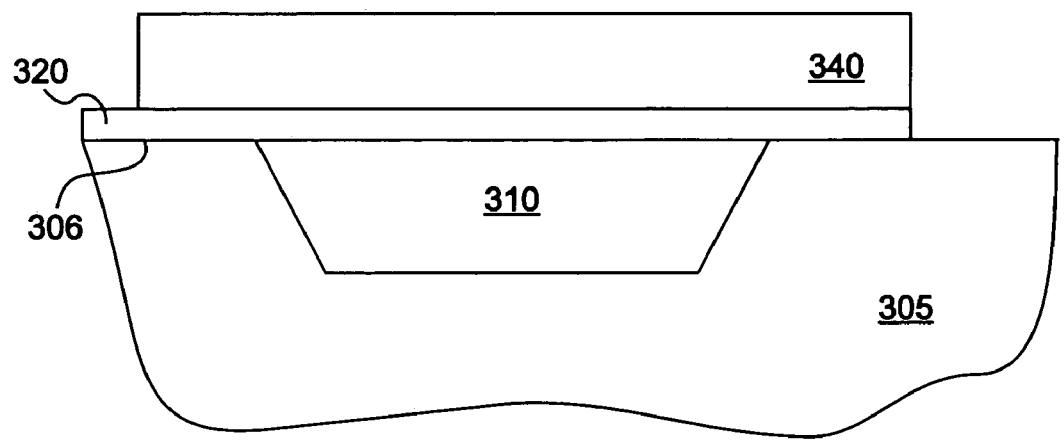
FIG. 5A is a drawing of another stage in the fabrication of the resonator of FIG. 3A.

FIG. 5A is a drawing of another stage in the fabrication of the resonator 110 of FIG. 3A. In FIG. 5A, the structure is shown in a side view. In this example following fabrication of the structure of FIG. 4B, the piezoelectric layer 340 is deposited onto the wafer 305 and over the bottom electrode 320. Again, well known photolithography steps are used to define and create the piezoelectric layer 340. As an example, a layer of aluminum nitride could be deposited onto the wafer 305 followed by the spinning of photoresist onto the wafer 305; the photoresist could be exposed through a photomask and subsequently developed to appropriately pattern the photoresist; and then the aluminum nitride could be etched to appropriately pattern the piezoelectric layer 340 followed by removal of the remaining photoresist.

Figure 5B:
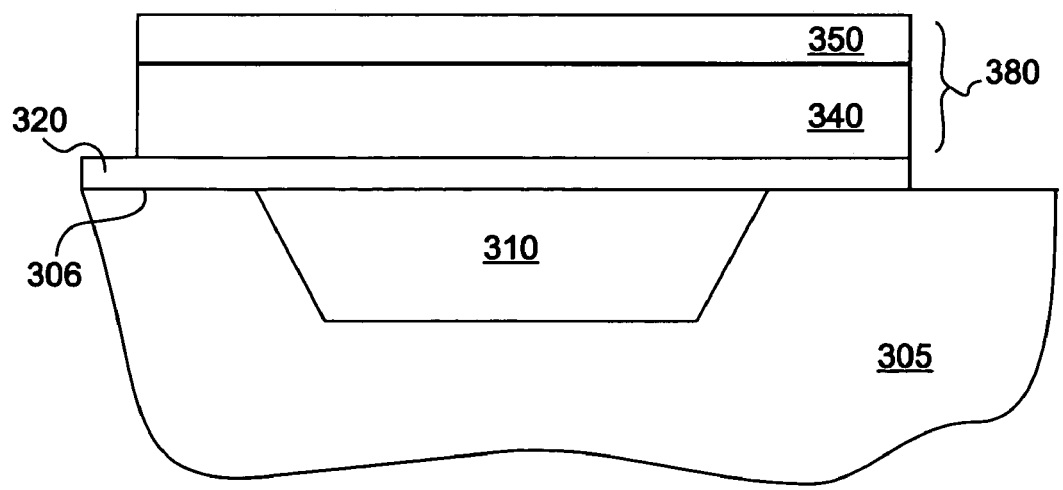
FIG. 5B is a drawing of still another stage in the fabrication of the resonator of FIG. 3A.

FIG. 5B is a drawing of still another stage in the fabrication of the resonator 110 of FIG. 3A. In FIG. 5B, the structure is shown in a side view. In this example following fabrication of the structure of FIG. 5A, the compensation layer 350 is deposited above the piezoelectric layer 340. In this representative embodiment, the composite structure 380 comprises the combination of the compensation layer 350 overlaying the piezoelectric layer 340. Again, well known photolithography steps are used to define and create the compensation layer 350. As an example, a layer of compensation material could be deposited onto the wafer 305 followed by the spinning of photoresist onto the wafer 305; the photoresist could be exposed through a photomask and subsequently developed to appropriately pattern the photoresist; and then the compensation material could be etched to appropriately pattern the compensation layer 350 followed by removal of the remaining photoresist.

In a representative embodiment, the compensation material comprising the compensation layer 350 is borosilicate glass which could be deposited onto the piezoelectric layer 340 by chemical vapor deposition (CVD) or by plasma-enhanced chemical vapor deposition (PECVD).

Figure 5C:
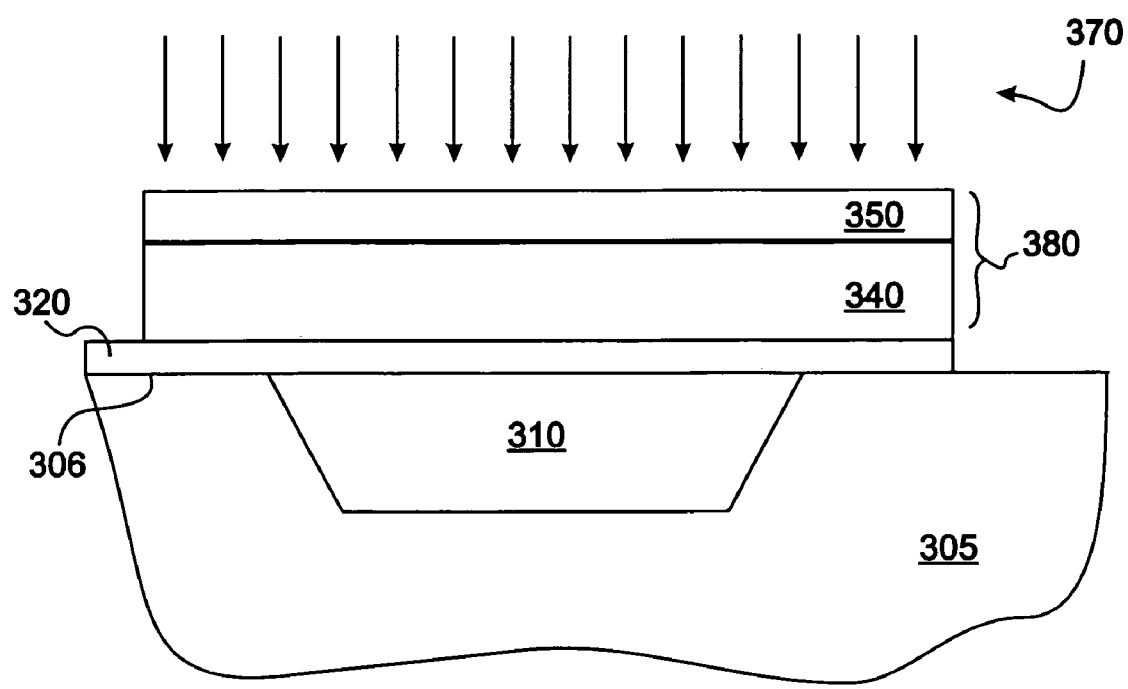
FIG. 5C is a drawing of yet another stage in the fabrication of the resonator of FIG. 3A.

FIG. 5C is a drawing of yet another stage in the fabrication of the resonator 110 of FIG. 3A. In FIG. 5C, the structure is shown in a side view. In this example following fabrication of the structure of FIG. 5B, the material of the compensation layer 350 receives an ion implant 370. In this representative embodiment, the composite structure 380 comprises the ion implanted combination of the compensation layer 350 overlaying the piezoelectric layer 340. For this representative embodiment, the material comprising the compensation layer 350 could be, for example, silicon dioxide deposited via a low temperature chemical vapor deposition (CVD) process with a thickness typically ranging between 200 and 5,000 Angstroms. The ion implant 370 of FIG. 5C could comprise, for example, boron implanted into the silicon dioxide of the compensation layer 350 at an energy of approximately 30 keV and a dose of approximately $2.5 \times 10^{15}$ atoms per square centimeter.

In various representative embodiments, following the fabrication of the structure in FIG. 5B the structure of FIG. 3A can be obtained by fabricating the top electrode 330 using well known technologies such as deposition and photolithography. As an example, a layer of molybdenum could be deposited onto the wafer 305 and over the compensation layer 350 followed by the spinning of photoresist onto the wafer 305, the photoresist could be exposed to appropriately pattern the photoresist, the photoresist could be subsequently developed, and then the molybdenum could be etched to form the appropriately patterned top electrode 330.

In various other representative embodiments, following the fabrication of the structure in FIG. 5C via the ion implant 370, the structure of FIG. 3A can be obtained by fabricating the top electrode 330 using well known technologies such as deposition and photolithography. As an example, a layer of molybdenum could be deposited onto the wafer 305 and over the compensation layer 350 followed by the spinning of photoresist onto the wafer 305, the photoresist could be exposed to appropriately pattern the photoresist, the photoresist could be subsequently developed, and then the molybdenum could be etched to form the appropriately patterned top electrode 330.

Figure 6A:
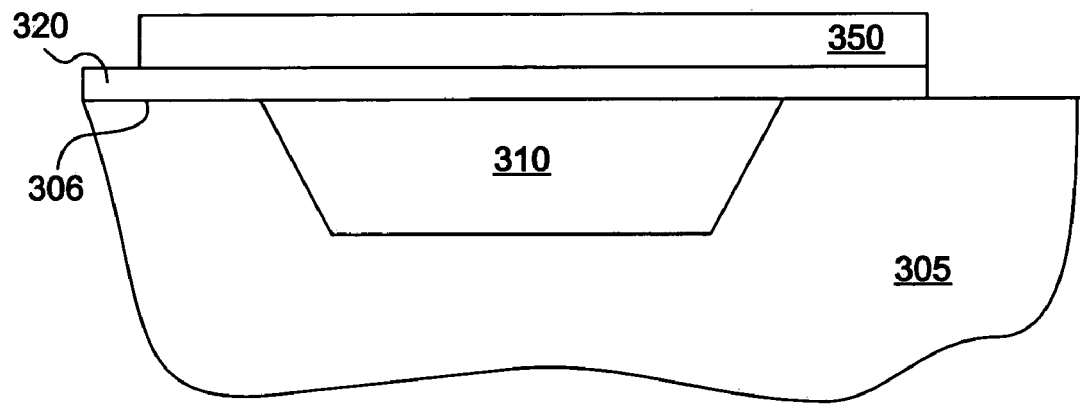
FIG. 6A is a drawing of another stage in the fabrication of the resonators of FIGS. 3B and 3C.

FIG. 6A is a drawing of another stage in the fabrication of the resonators 110 of FIGS. 3B and 3C. In FIG. 6A, the structure is shown in a side view. In this example following fabrication of the structure of FIG. 4B, the compensation layer 350 is deposited onto the wafer 305 and above the bottom electrode 320. Again, well known photolithography steps are used to define and create the compensation layer 350. As an example, a layer of compensation material could be deposited onto the wafer 305 followed by the spinning of photoresist onto the wafer 305; the photoresist could be exposed through a photomask and subsequently developed to appropriately pattern the photoresist; and then the compensation material could be etched to appropriately pattern the compensation layer 350 followed by removal of the remaining photoresist.

In a representative embodiment, the material comprising the compensation layer 350 is borosilicate glass which could be deposited onto the piezoelectric layer 340 by chemical vapor deposition (CVD) or by plasma-enhanced chemical vapor deposition (PECVD).

Figure 6B:
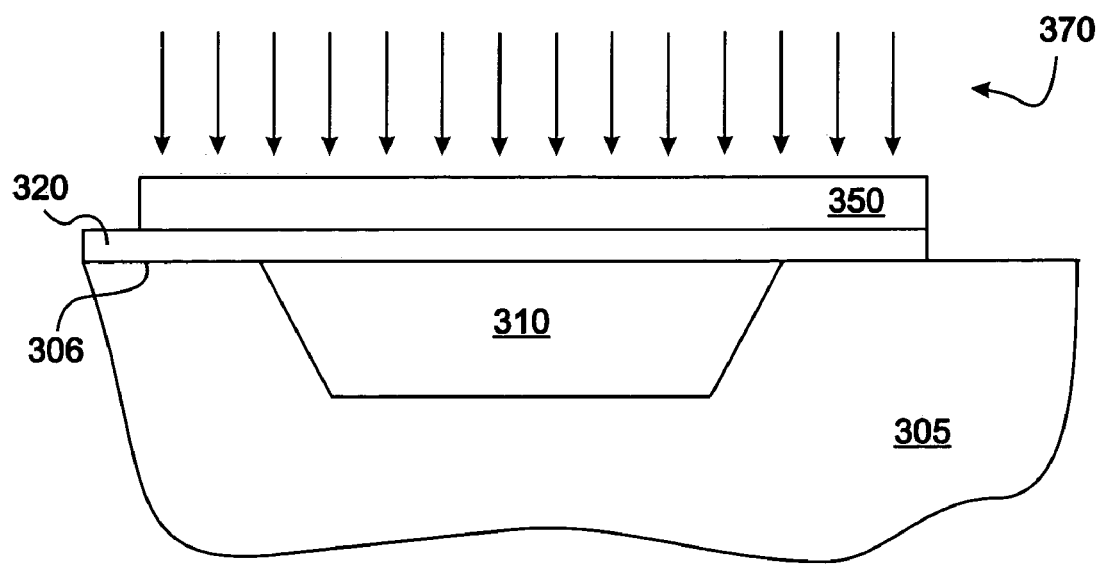
FIG. 6B is a drawing of still another stage in the fabrication of the resonators of FIGS. 3B and 3C.

FIG. 6B is a drawing of still another stage in the fabrication of the resonators 110 of FIGS. 3B and 3C. In FIG. 6B, the structure is shown in a side view. In this example following fabrication of the structure of FIG. 6A, the material of the compensation layer 350 receives an ion implant 370. For this representative embodiment, the material comprising the compensation layer 350 could be, for example, silicon dioxide deposited via a low temperature chemical vapor deposition (CVD) process with a thickness typically ranging between 200 and 5,000 Angstroms. The ion implant 370 of FIG. 6B could comprise, for example, boron implanted into the silicon dioxide of the compensation layer 350 at an energy of approximately 30 keV and a dose of approximately $2.5 \times 10^{15}$ atoms per square centimeter.

Figure 6C:
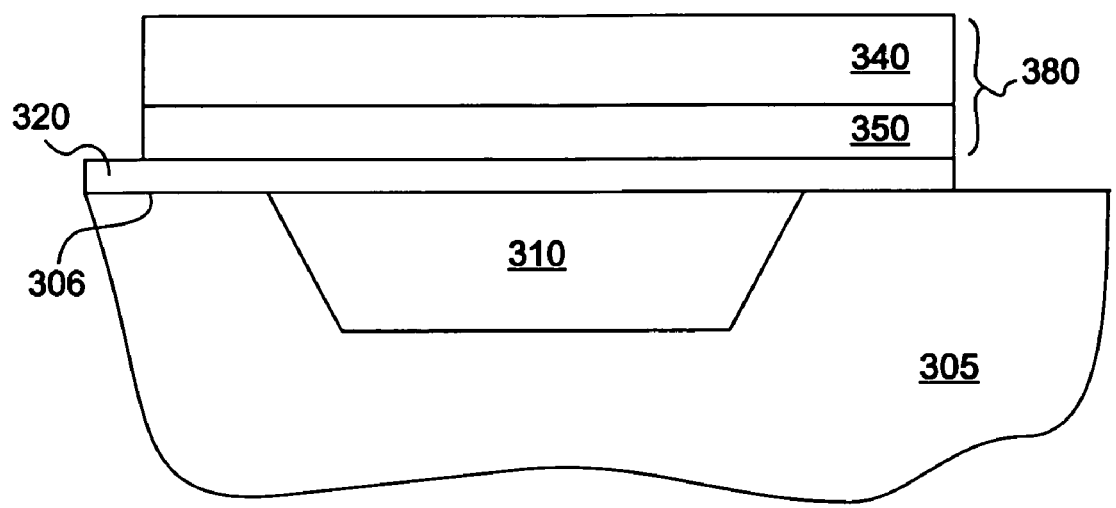
FIG. 6C is a drawing of yet another stage in the fabrication of the resonators of FIGS. 3B and 3C.

FIG. 6C is a drawing of yet another stage in the fabrication of the resonators 110 of FIGS. 3B and 3C. In FIG. 6C, the structure is shown in a side view. In this example following fabrication of the structure of FIG. 6A or alternatively that of FIG. 6B, the piezoelectric layer 340 is deposited above the compensation layer 350. For representative embodiments of the resonator 110 of FIG. 3B, the composite structure 380 comprises the combination of the piezoelectric layer 340 overlaying the compensation layer 350 wherein the compensation layer 350 may or may not be ion implanted. Again, well known photolithography steps are used to define and create the piezoelectric layer 340. As an example, a layer of aluminum nitride could be deposited onto the wafer 305 and above the compensation layer 350 followed by the spinning of photoresist onto the wafer 305; the photoresist could be exposed through a photomask and subsequently developed to appropriately pattern the photoresist; and then the aluminum nitride could be etched to appropriately pattern the piezoelectric layer 340 followed by removal of the remaining photoresist.

In various representative embodiments, following the fabrication of the structure in FIG. 6C with omission of the ion implant 370 of FIG. 6B, the structure of FIG. 3B can be obtained by fabricating the top electrode 330 using well known technologies such as deposition and photolithography. As an example, a layer of molybdenum could be deposited onto the wafer 305 and over the piezoelectric layer 340 followed by the spinning of photoresist onto the wafer 305, the photoresist could be exposed to appropriately pattern the photoresist, the photoresist could be subsequently developed, and then the molybdenum could be etched to form the appropriately patterned top electrode 330 followed by removal of the remaining photoresist.

In various other representative embodiments, following the fabrication of the structure in FIG. 6C including the ion implant 370 of FIG. 6B, the structure of FIG. 3B can be obtained by fabricating the top electrode 330 using well known technologies such as deposition and photolithography. As an example, a layer of molybdenum could be deposited onto the wafer 305 and over the compensation layer 350 followed by the spinning of photoresist onto the wafer 305, the photoresist could be exposed to appropriately pattern the photoresist, the photoresist could be subsequently developed, and then the molybdenum could be etched to form the appropriately patterned top electrode 330 followed by removal of the remaining photoresist.

Figure 7A:
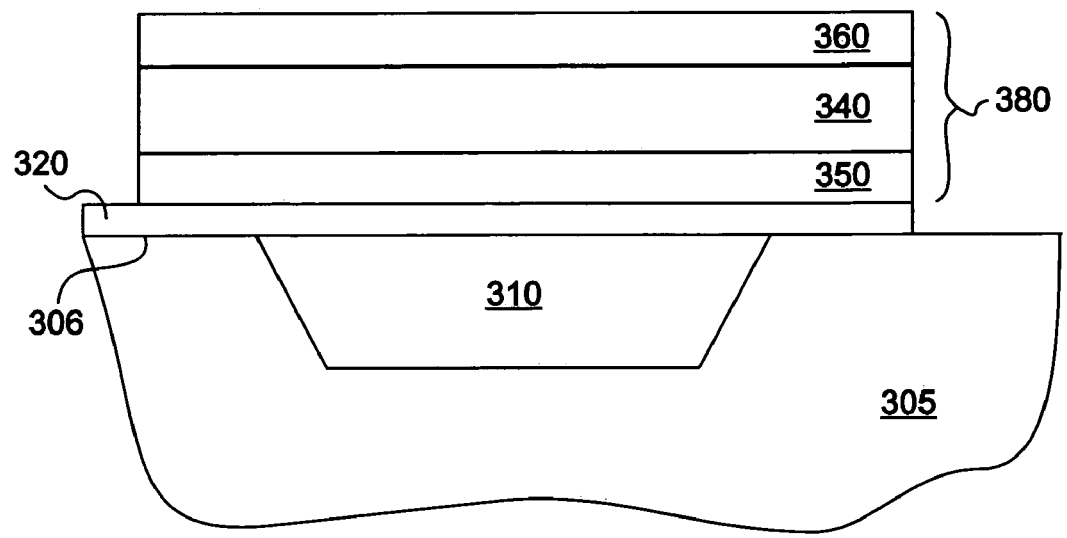
FIG. 7A is a drawing of another stage in the fabrication of the resonator of FIG. 3C.

FIG. 7A is a drawing of another stage in the fabrication of the resonator 110 of FIG. 3C. In FIG. 7A, the structure is shown in a side view. In this example following fabrication of the structure of FIG. 6C either omitting or including the ion implant 370 of FIG. 6B, the additional compensation layer 360 is deposited above the piezoelectric layer 340. In this representative embodiment, the composite structure 380 comprises the combination of the piezoelectric layer 340 overlaying the compensation layer 350 and the additional compensation layer 360 overlaying the piezoelectric layer 340 wherein the compensation layer 350 may or may not be ion implanted. Again, well known photolithography steps are used to define and create the additional compensation layer 360. As an example, a layer of the additional compensation material could be deposited onto a wafer 305 and over the piezoelectric layer 340 followed by the spinning of photoresist onto the wafer 305; the photoresist could be exposed through a photomask and subsequently developed to appropriately pattern the photoresist; and then the compensation material could be etched to appropriately pattern the additional compensation layer 360 followed by removal of the remaining photoresist.

In a representative embodiment, the material comprising the additional compensation layer 360 is borosilicate glass which could be deposited onto the piezoelectric layer 340 by chemical vapor deposition (CVD) or by plasma-enhanced chemical vapor deposition (PECVD).

Figure 7B:
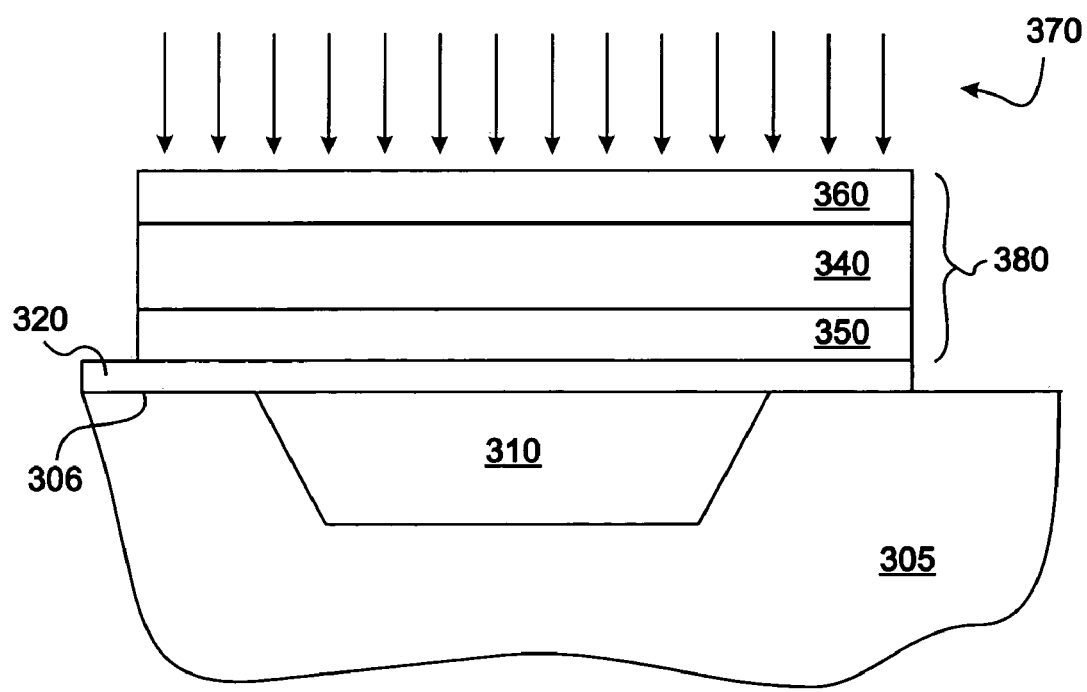
FIG. 7B is a drawing of still another stage in the fabrication of the resonator of FIG. 3C.

FIG. 7B is a drawing of still another stage in the fabrication of the resonator 110 of FIG. 3C. In FIG. 7B, the structure is shown in a side view. In this example following fabrication of the structure of FIG. 7A, the material of the additional compensation layer 360 receives an ion implant 370. In this representative embodiment, the composite structure 380 comprises the combination of the piezoelectric layer 340 overlaying the compensation layer 350 and the additional compensation layer 360 overlaying the piezoelectric layer 340 wherein the additional compensation layer 360 has been ion implanted. For this representative embodiment, the material comprising the additional compensation layer 360 could be, for example, silicon dioxide deposited via a low temperature chemical vapor deposition (CVD) process with a thickness typically ranging between 200 and 5,000 Angstroms. The ion implant 370 of FIG. 7B could comprise, for example, boron implanted into the silicon dioxide of the additional compensation layer 360 at an energy of approximately 30 keV and a dose of approximately $2.5 \times 10^{15}$ atoms per square centimeter.

In various representative embodiments, following the fabrication of the structure in FIG. 7A and not including the ion implant 370 of FIG. 7B, the structure of FIG. 3C can be obtained by fabricating the top electrode 330 using well known technologies such as deposition and photolithography. As an example, a layer of molybdenum could be deposited onto the wafer 305 and over the additional compensation layer 360 followed by the spinning of photoresist onto the wafer 305, the photoresist could be exposed to appropriately pattern the photoresist, the photoresist could be subsequently developed, and then the molybdenum could be etched to form the appropriately patterned top electrode 330.

In various other representative embodiments, following the fabrication of the structure in FIG. 7B after the ion implant 370, the structure of FIG. 3C can be obtained by fabricating the top electrode 330 using well known technologies such as deposition and photolithography. As an example, a layer of molybdenum could be deposited onto the wafer 305 and over the additional compensation layer 360 followed by the spinning of photoresist onto the wafer 305, the photoresist could be exposed to appropriately pattern the photoresist, the photoresist could be subsequently developed, and then the molybdenum could be etched to form the appropriately patterned top electrode 330.

Figure 8:
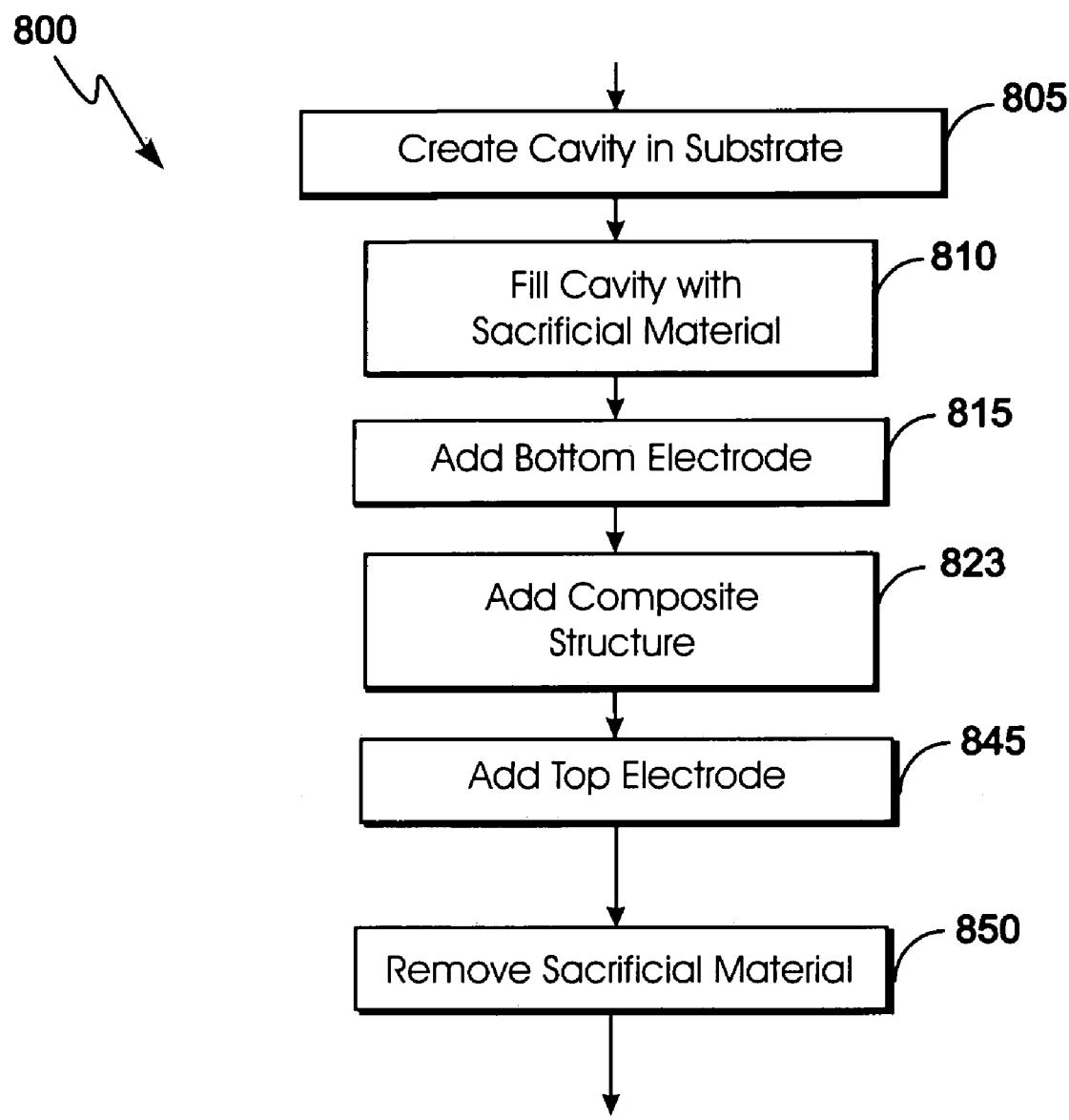
FIG. 8 is a flow chart of a method for fabricating the resonators of FIGS. 3A-3C.

FIG. 8 is a flow chart of a method 800 for fabricating the resonators 110 of FIGS. 3A-3C. In block 805, the cavity 310 is created in the substrate 305. The cavity 310 can be fabricated using well known technologies such as oxide formation, photolithography, and etch. As an example, a layer of silicon dioxide could be grown on a wafer 305 followed by the spinning of photoresist onto the wafer 305; the photoresist could be exposed through a photomask having the appropriate pattern; the photoresist could be subsequently developed to appropriately pattern the photoresist; the exposed silicon dioxide could be etched to appropriately pattern the silicon dioxide; the remaining photoresist could be removed; and then the silicon substrate could be etched using the patterned silicon dioxide as a mask to appropriately pattern the cavity 310. Block 805 then transfers control to block 810.

In block 810, the cavity 310 is filled with a sacrificial material. The sacrificial material can be removed later and could be a phosphorus silica glass material comprising approximately 8% phosphorus and approximately 92% silicon dioxide. The cavity 310 can be filled with the sacrificial material using well known technologies such as oxide deposition with subsequent surface polishing and etching to form a smooth surface. As an example, a layer of phosphorus silica glass could be deposited onto the wafer 305 followed by a mechanical polishing and chemical etching of the wafer surface to flatten and smooth the surface leaving the phosphorus silica glass in the cavity 310. Block 810 then transfers control to block 815.

In block 815, the bottom electrode 320 is created above the sacrificial material in the cavity 310. The bottom electrode 320 can be fabricated using well known technologies such as deposition, photolithography, and etch. As an example, a layer of molybdenum could be deposited onto the wafer 305 and over the sacrificial material in the cavity 310 followed by the spinning of photoresist onto the wafer 305; the photoresist could be exposed through a photomask having the appropriate pattern; the photoresist could be subsequently developed to appropriately pattern the photoresist; the exposed material of the bottom electrode 320 could be etched to appropriately pattern the bottom electrode 320; and then the remaining photoresist could be removed. Block 815 then transfers control to block 823.

In block 823, the composite structure 380 is created above the bottom electrode 320. The composite structure 380 can be fabricated using well known technologies such as deposition, photolithography, and etch. Various representative embodiments of the composite structure 380 have been disclosed in the discussions of and in FIGS. 3A-3B, 5A-5C, 6A-6C, and 7A-7B. Various representative embodiments of methods for fabricating the composite structure 380 can be found in the discussions of blocks 920-940 of FIG. 9, blocks 1020-1040 of FIG. 10, and blocks 1120-1160 of FIG. 11. Block 823 then transfers control to block 845.

In block 845, the top electrode 330 is created above the composite structure 380. The top electrode 330 can be fabricated using well known technologies such as deposition, photolithography, and etch. As an example a layer of molybdenum could be deposited onto the wafer 305 and over the compensation layer 350 followed by the spinning of photoresist onto the wafer 305; the photoresist could be exposed through a photomask having the appropriate pattern; the photoresist could be subsequently developed to appropriately pattern the photoresist; the exposed material of the top electrode 330 could be etched to appropriately pattern the top electrode 330; and then the remaining photoresist could be removed. Block 845 then transfers control to block 850.

In block 850, the sacrificial material previously deposited in the cavity 310 is removed. Should the sacrificial material be phosphorus silica glass, hydrofluoric acid can be used to etch it from the cavity 310. Block 850 then terminates the process.

Should a mass load layer be included on the resonator 110, it can be fabricated prior to the process steps of block 850 using well known technologies such as deposition, photolithography, and etch. As an example, a layer of molybdenum or other material could be deposited over the top electrode 330 onto the wafer 305 followed by the spinning of photoresist onto the wafer 305; the photoresist could be exposed through a photomask having the appropriate pattern; the photoresist could be subsequently developed to appropriately pattern the photoresist; the exposed mass load layer material could be etched to appropriately pattern the mass load layer; and then the remaining photoresist could be removed.

As will be known to one skilled in the art, in other representative embodiments, various changes can be made to the above described processes to effect similar structures to those just described.

Figure 9:
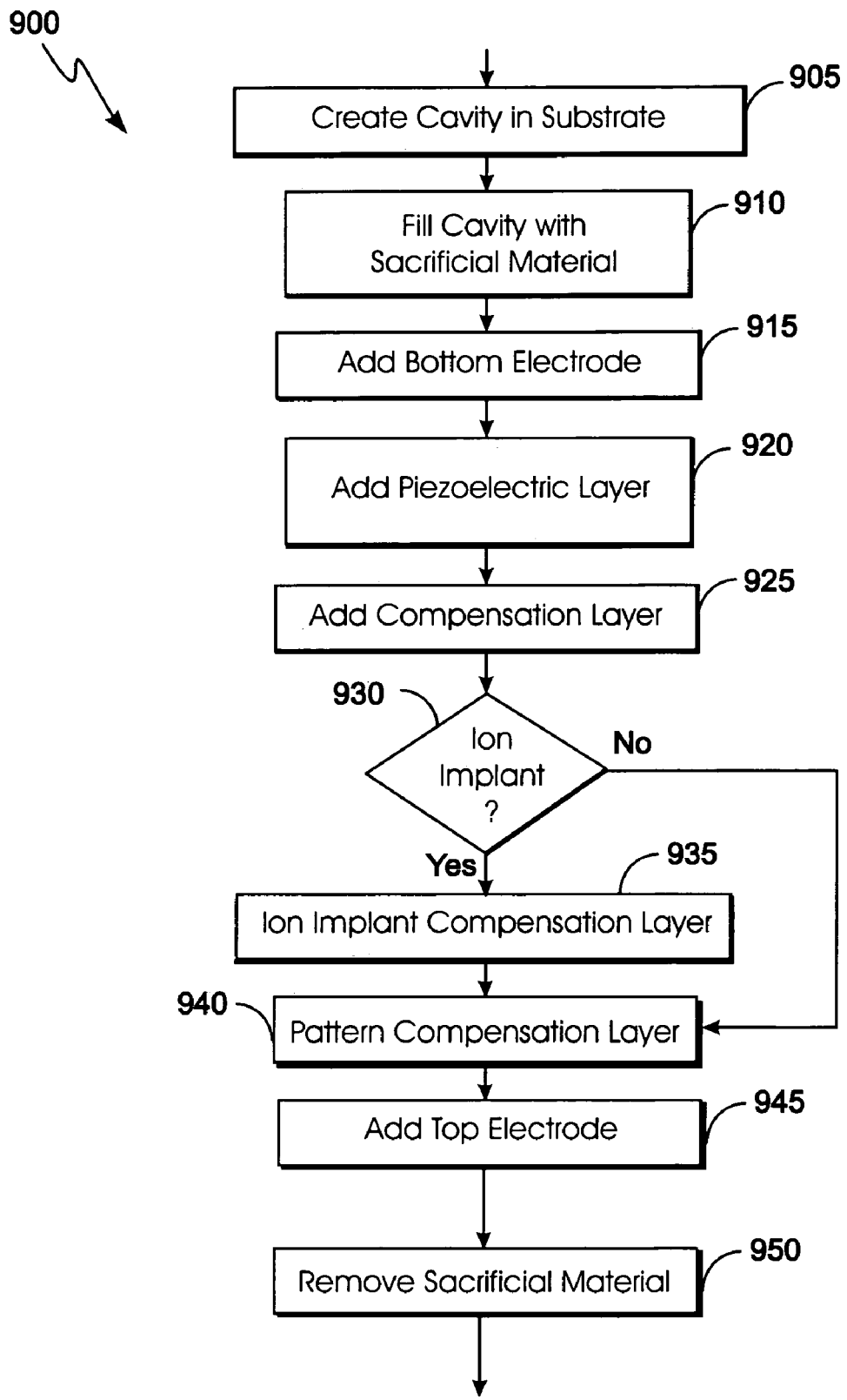
FIG. 9 is a flow chart of a method for fabricating the resonator of FIG. 3A.

FIG. 9 is a flow chart of a method 900 for fabricating the resonator 110 of FIG. 3A. In block 905, the cavity 310 is created in the substrate 305. The cavity 310 can be fabricated using well known technologies such as oxide formation, photolithography, and etch. As an example, a layer of silicon dioxide could be grown on a wafer 305 followed by the spinning of photoresist onto the wafer 305; the photoresist could be exposed through a photomask having the appropriate pattern; the photoresist could be subsequently developed to appropriately pattern the photoresist; the exposed silicon dioxide could be etched to appropriately pattern the silicon dioxide; the remaining photoresist could be removed; and then the silicon substrate could be etched using the patterned silicon dioxide as a mask to appropriately pattern the cavity 310. Block 905 then transfers control to block 910.

In block 910, the cavity 310 is filled with a sacrificial material. The sacrificial material can be removed later and could be a phosphorus silica glass material comprising approximately 8% phosphorus and approximately 92% silicon dioxide. The cavity 310 can be filled with the sacrificial material using well known technologies such as oxide deposition with subsequent surface polishing and etching to form a smooth surface. As an example, a layer of phosphorus silica glass could be deposited onto the wafer 305 followed by a mechanical polishing and chemical etching of the wafer surface to flatten and smooth the surface leaving the phosphorus silica glass in the cavity 310. Block 910 then transfers control to block 915.

In block 915, the bottom electrode 320 is created above the sacrificial material in the cavity 310. The bottom electrode 320 can be fabricated using well known technologies such as deposition, photolithography, and etch. As an example, a layer of molybdenum could be deposited onto the wafer 305 and over the sacrificial material in the cavity 310 followed by the spinning of photoresist onto the wafer 305; the photoresist could be exposed through a photomask having the appropriate pattern; the photoresist could be subsequently developed to appropriately pattern the photoresist; the exposed material of the bottom electrode 320 could be etched to appropriately pattern the bottom electrode 320; and then the remaining photoresist could be removed. Block 915 then transfers control to block 920.

In block 920, the piezoelectric layer 340 is created above the bottom electrode 320. The piezoelectric layer 340 can be fabricated using well known technologies such as deposition, photolithography, and etch. As an example, a layer of aluminum nitride could be deposited onto the wafer 305 and over the bottom electrode 320 followed by the spinning of photoresist onto the wafer 305; the photoresist could be exposed through a photomask having the appropriate pattern; the photoresist could be subsequently developed to appropriately pattern the photoresist; the exposed material of the piezoelectric layer 340 could be etched to appropriately pattern the piezoelectric layer 340; and then the remaining photoresist could be removed. Block 920 then transfers control to block 925.

In block 925, the compensation layer 350 is added on top of the piezoelectric layer 340 of the resonator 110. The compensation layer 350 can be added using well known technologies such as deposition. As an example, in a representative embodiment, a layer of borosilicate glass could be deposited onto the wafer 305 and over the piezoelectric layer 340, and in another representative embodiment, a layer of silicon dioxide which will later receive an ion implant 377 of boron could be deposited onto the wafer 305 and over the piezoelectric layer 340. Block 925 then transfers control to block 930.

If the compensation layer 350 is to be ion implanted, block 930 transfers control to block 935. Otherwise block 930 transfers control to block 940.

In block 935, the compensation layer 350 receives an ion implant 377. This ion implant could be, for example, boron atoms implanted into the compensation layer 350 at an energy of 30 keV and a dose of $2.5 \times 10^{15}$ atoms per square centimeter. Block 935 then transfers control to block 940.

In block 940, the compensation layer 350 is patterned. The compensation layer 350 can be patterned using well known technologies such as photolithography and etch. As an example, in a representative embodiment, photoresist is spun onto the wafer 305; the photoresist could be exposed through a photomask having the appropriate pattern; the photoresist could be subsequently developed to appropriately pattern the photoresist; the exposed material of the compensation layer 350 could be etched to appropriately pattern the compensation layer 350; and then the remaining photoresist could be removed. Block 940 then transfers control to block 945.

In block 945, the top electrode 330 is created above the compensation layer 350. The top electrode 330 can be fabricated using well known technologies such as deposition, photolithography, and etch. As an example a layer of molybdenum could be deposited onto the wafer 305 and over the compensation layer 350 followed by the spinning of photoresist onto the wafer 305; the photoresist could be exposed through a photomask having the appropriate pattern; the photoresist could be subsequently developed to appropriately pattern the photoresist; the exposed material of the top electrode 330 could be etched to appropriately pattern the top electrode 330; and then the remaining photoresist could be removed. Block 945 then transfers control to block 950.

In block 950, the sacrificial material previously deposited in the cavity 310 is removed. Should the sacrificial material be a phosphorus silica glass, hydrofluoric acid can be used to etch it from the cavity 310. Block 950 then terminates the process.

Should a mass load layer be included on the resonator 110, it can be fabricated prior to the process steps of block 950 using well known technologies such as deposition, photolithography, and etch. As an example, a layer of molybdenum or other material could be deposited onto the wafer 305 and over the top electrode 330 followed by the spinning of photoresist onto the wafer 305; the photoresist could be exposed through a photomask having the appropriate pattern; the photoresist could be subsequently developed to appropriately pattern the photoresist; the exposed mass load layer material could be etched to appropriately pattern the mass load layer; and then the remaining photoresist could be removed.

As will be known to one skilled in the art, in other representative embodiments, various changes can be made to the above described processes to effect similar structures to those just described.

Figure 10:
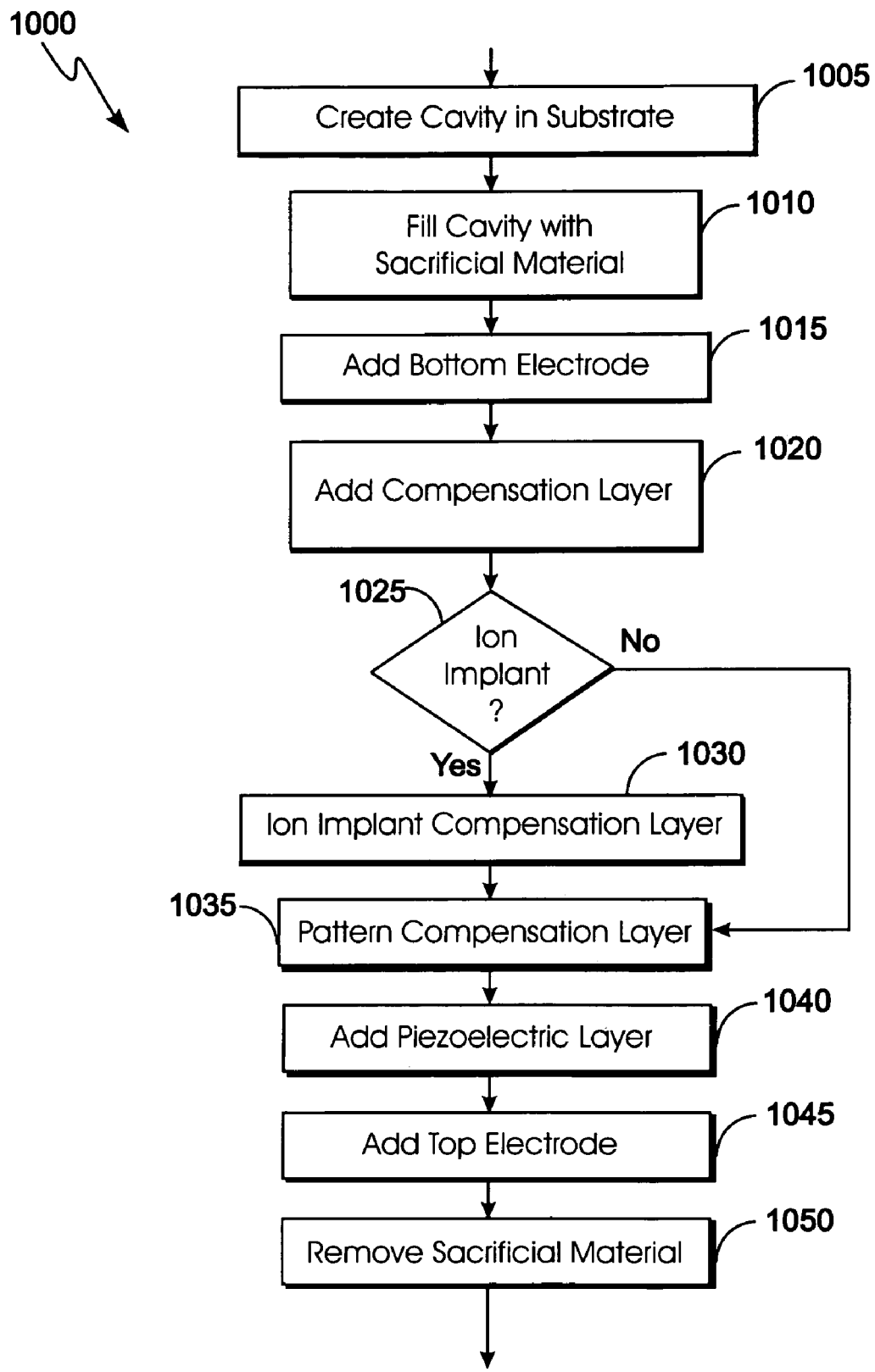
FIG. 10 is a flow chart of a method for fabricating the resonator of FIG. 3B.

FIG. 10 is a flow chart of a method 1000 for fabricating the resonator 110 of FIG. 3B. In block 1005, the cavity 310 is created in the substrate 305. The cavity 310 can be fabricated using well known technologies such as oxide formation, photolithography, and etch. As an example, a layer of silicon dioxide could be grown on a wafer 305 followed by spinning of photoresist onto the wafer 305; the photoresist could be exposed through a photomask having the appropriate pattern; the photoresist could be subsequently developed to appropriately pattern the photoresist; the exposed silicon dioxide could be etched to appropriately pattern the silicon dioxide; the remaining photoresist could be removed; and then the silicon substrate could be etched using the patterned silicon dioxide as a mask to appropriately pattern the cavity 310. Block 1005 then transfers control to block 1010.

In block 1010, the cavity 310 is filled with a sacrificial material. The sacrificial material can be removed later and could be a phosphorus silica glass material comprising approximately 8% phosphorus and approximately 92% silicon dioxide. The cavity 310 can be filled with the sacrificial material using well known technologies such as oxide deposition with subsequent surface polishing and etching to form a smooth surface. As an example, a layer of phosphorus silica glass could be deposited onto the wafer 305 followed by a mechanical polishing and chemical etching of the wafer surface to flatten and smooth the surface leaving the phosphorus silica glass in the cavity 310. Block 1010 then transfers control to block 1015.

In block 1015, the bottom electrode 320 is created above the sacrificial material in the cavity 310. The bottom electrode 320 can be fabricated using well known technologies such as deposition, photolithography, and etch. As an example, a layer of molybdenum could be deposited onto the wafer 305 and over the sacrificial material in the cavity 310 followed by the spinning of photoresist onto the wafer 305; the photoresist could be exposed through a photomask having the appropriate pattern; the photoresist could be subsequently developed to appropriately pattern the photoresist; the exposed material of the bottom electrode 320 could be etched to appropriately pattern the bottom electrode 320; and then the remaining photoresist could be removed. Block 1015 then transfers control to block 1020.

In block 1020, the compensation layer 350 is added on top of the piezoelectric layer 340 of the resonator 110. The compensation layer 350 can be added using well known technologies such as deposition. As an example, in a representative embodiment, a layer of borosilicate glass could be deposited onto the wafer 305 and over the piezoelectric layer 340, and in another representative embodiment, a layer of silicon dioxide which will later receive an ion implant 377 of boron could be deposited onto the wafer 305 and over the piezoelectric layer 340. Block 1020 then transfers control to block 1025.

If the compensation layer 350 is to be ion implanted, block 1025 transfers control to block 1030. Otherwise block 1025 transfers control to block 1035.

In block 1030, the compensation layer 350 receives an ion implant 377. This ion implant could be, for example, boron atoms implanted into the compensation layer 350 at an energy of 30 keV and a dose of $2.5 \times 10^{15}$ atoms per square centimeter. Block 1030 then transfers control to block 1035.

In block 1035, the compensation layer 350 is patterned. The compensation layer 350 can be patterned using well known technologies such as photolithography and etch. As an example, in a representative embodiment, photoresist is spun onto the wafer 305; the photoresist could be exposed through a photomask having the appropriate pattern; the photoresist could be subsequently developed to appropriately pattern the photoresist; the exposed material of the compensation layer 350 could be etched to appropriately pattern the compensation layer 350; and then the remaining photoresist could be removed. Block 1035 then transfers control to block 1040.

In block 1040, the piezoelectric layer 340 is created above the bottom electrode 320. The piezoelectric layer 340 can be fabricated using well known technologies such as deposition, photolithography, and etch. As an example, a layer of aluminum nitride could be deposited onto the wafer 305 and over the bottom electrode 320 followed by the spinning of photoresist onto the wafer 305; the photoresist could be exposed through a photomask having the appropriate pattern; the photoresist could be subsequently developed to appropriately pattern the photoresist; the exposed material of the piezoelectric layer 340 could be etched to appropriately pattern the piezoelectric layer 340; and then the remaining photoresist could be removed. Block 1040 then transfers control to block 1045.

In block 1045, the top electrode 330 is created above the compensation layer 350. The top electrode 330 can be fabricated using well known technologies such as deposition, photolithography, and etch. As an example a layer of molybdenum could be deposited onto the wafer 305 and over the compensation layer 350 followed by the spinning of photoresist onto the wafer 305; the photoresist could be exposed through a photomask having the appropriate pattern; the photoresist could be subsequently developed to appropriately pattern the photoresist; the exposed material of the top electrode 330 could be etched to appropriately pattern the top electrode 330; and then the remaining photoresist could be removed. Block 1045 then transfers control to block 1050.

In block 1050, the sacrificial material previously deposited in the cavity 310 is removed. Should the sacrificial material be phosphorus silica glass, hydrofluoric acid can be used to etch it from the cavity 310. Block 1050 then terminates the process.

Should a mass load layer be included on the resonator 110, it can be fabricated prior to the process steps of block 1050 using well known technologies such as deposition, photolithography, and etch. As an example, a layer of molybdenum or other material could be deposited onto the wafer 305 and over the top electrode 330 followed by the spinning of photoresist onto the wafer 305; the photoresist could be exposed through a photomask having the appropriate pattern; the photoresist could be subsequently developed to appropriately pattern the photoresist; the exposed mass load layer material could be etched to appropriately pattern the mass load layer; and then the remaining photoresist could be removed.

As will be known to one skilled in the art, in other representative embodiments, various changes can be made to the above described processes to effect similar structures to those just described.

Figure 11:
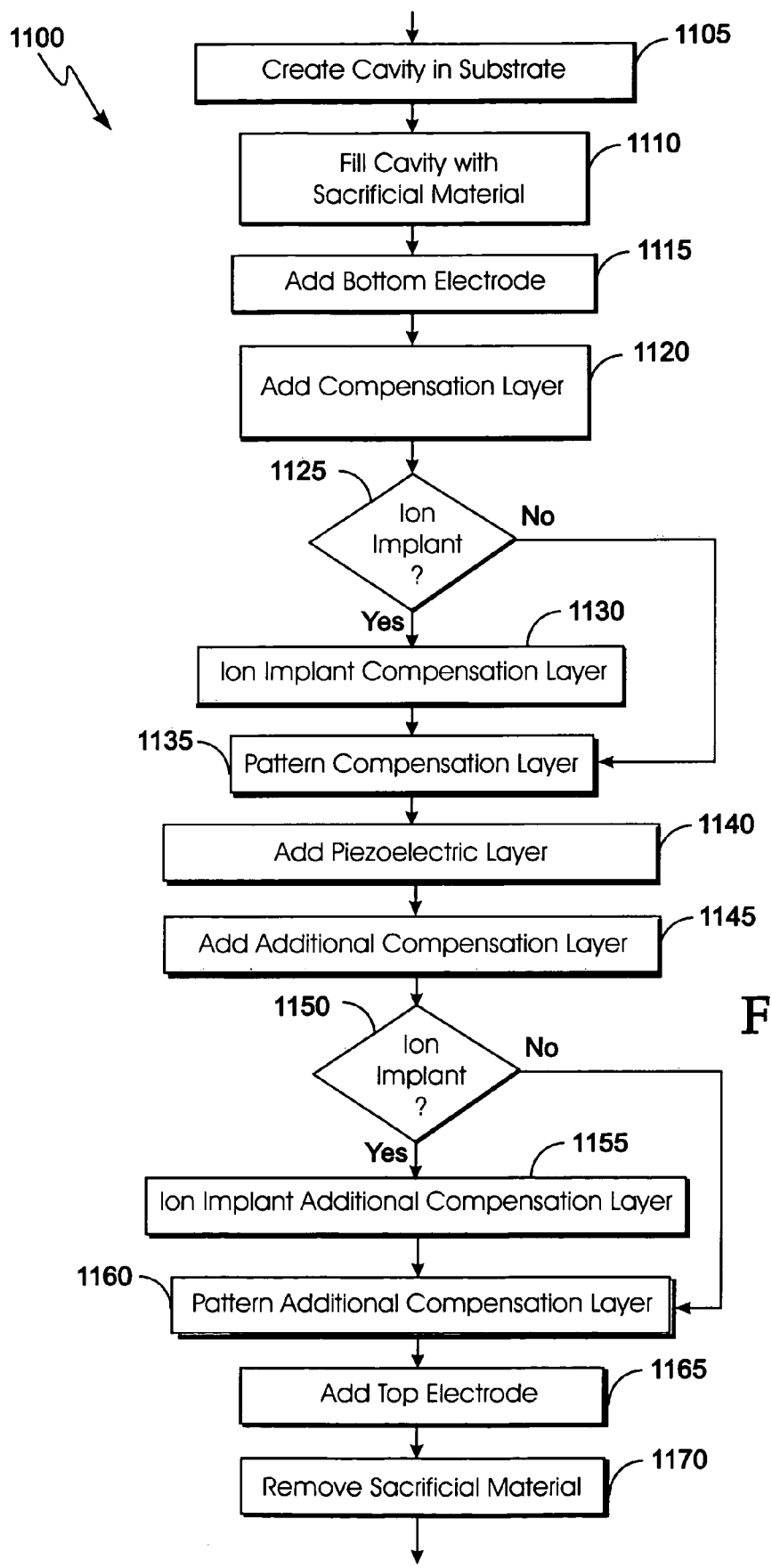
FIG. 11 is a flow chart of a method for fabricating the resonator of FIG. 3C.

FIG. 11 is a flow chart of a method 1100 for fabricating the resonator 110 of FIG. 3C. In block 1105, the cavity 310 is created in the substrate 305. The cavity 310 can be fabricated using well known technologies such as oxide formation, photolithography, and etch. As an example, a layer of silicon dioxide could be grown on a wafer 305 followed by the spinning of photoresist onto the wafer 305; the photoresist could be exposed through a photomask having the appropriate pattern; the photoresist could be subsequently developed to appropriately pattern the photoresist; the exposed silicon dioxide could be etched to appropriately pattern the silicon dioxide; the remaining photoresist could be removed; and then the silicon substrate could be etched using the patterned silicon dioxide as a mask to appropriately pattern the cavity 310. Block 1105 then transfers control to block 1110.

In block 1110, the cavity 310 is filled with a sacrificial material. The sacrificial material can be removed later and could be a phosphorus silica glass material comprising approximately 8% phosphorus and approximately 92% silicon dioxide. The cavity 310 can be filled with the sacrificial material using well known technologies such as oxide deposition with subsequent surface polishing and etching to form a smooth surface. As an example, a layer of phosphorus silica glass could be deposited onto the wafer 305 followed by a mechanical polishing and chemical etching of the wafer surface to flatten and smooth the surface leaving the phosphorus silica glass in the cavity 310. Block 1110 then transfers control to block 1115.

In block 1115, the bottom electrode 320 is created above the sacrificial material in the cavity 310. The bottom electrode 320 can be fabricated using well known technologies such as deposition, photolithography, and etch. As an example, a layer of molybdenum could be deposited over the sacrificial material in the cavity 310 onto the wafer 305 followed by the spinning of photoresist onto the wafer 305; the photoresist could be exposed through a photomask having the appropriate pattern; the photoresist could be subsequently developed to appropriately pattern the photoresist; the exposed material of the bottom electrode 320 could be etched to appropriately pattern the bottom electrode 320; and then the remaining photoresist could be removed. Block 1115 then transfers control to block 1120.

In block 1120, the compensation layer 350 is added on top of the piezoelectric layer 340 of the resonator 110. The compensation layer 350 can be added using well known technologies such as deposition. As an example, in a representative embodiment, a layer of borosilicate glass could be deposited onto the wafer 305 and over the piezoelectric layer 340, and in another representative embodiment, a layer of silicon dioxide which will later receive an ion implant 377 of boron could be deposited onto the wafer 305 and over the piezoelectric layer 340. Block 1120 then transfers control to block 1125.

If the compensation layer 350 is to be ion implanted, block 1125 transfers control to block 1130. Otherwise block 1125 transfers control to block 1135.

In block 1130, the compensation layer 350 receives an ion implant 377. This ion implant could be, for example, boron atoms implanted into the compensation layer 350 at an energy of 30 keV and a dose of $2.5 \times 10^{15}$ atoms per square centimeter. Block 1130 then transfers control to block 1135.

In block 1135, the compensation layer 350 is patterned. The compensation layer 350 can be patterned using well known technologies such as photolithography and etch. As an example, in a representative embodiment, photoresist is spun onto the wafer 305; the photoresist could be exposed through a photomask having the appropriate pattern; the photoresist could be subsequently developed to appropriately pattern the photoresist; the exposed material of the compensation layer 350 could be etched to appropriately pattern the compensation layer 350; and then the remaining photoresist could be removed. Block 1135 then transfers control to block 1140.

In block 1140, the piezoelectric layer 340 is created above the bottom electrode 320. The piezoelectric layer 340 can be fabricated using well known technologies such as deposition, photolithography, and etch. As an example, a layer of aluminum nitride could be deposited onto the wafer 305 and over the bottom electrode 320 followed by the spinning of photoresist onto the wafer 305; the photoresist could be exposed through a photomask having the appropriate pattern; the photoresist could be subsequently developed to appropriately pattern the photoresist; the exposed material of the piezoelectric layer 340 could be etched to appropriately pattern the piezoelectric layer 340; and then the remaining photoresist could be removed. Block 1140 then transfers control to block 1145.

In block 1145, the additional compensation layer 360 is added on top of the piezoelectric layer 340 of the resonator 110. The additional compensation layer 360 can be added using well known technologies such as deposition. As an example, in a representative embodiment, a layer of borosilicate glass could be deposited onto the wafer 305 and over the piezoelectric layer 340, and in another representative embodiment, a layer of silicon dioxide which will later receive an ion implant 377 of boron could be deposited onto the wafer 305 and over the piezoelectric layer 340. Block 1145 then transfers control to block 1150.

If the additional compensation layer 360 is to be ion implanted, block 1150 transfers control to block 1155. Otherwise block 1150 transfers control to block 1160.

In block 1155, the additional compensation layer 360 receives an ion implant 377. This ion implant could be, for example, boron atoms implanted into the additional compensation layer 360 at an energy of 30 keV and a dose of $2.5 \times 10^{15}$ atoms per square centimeter. Block 1155 then transfers control to block 1160.

In block 1160, the additional compensation layer 360 is patterned. The additional compensation layer 360 can be patterned using well known technologies such as photolithography and etch. As an example, in a representative embodiment, photoresist is spun onto the wafer 305; the photoresist could be exposed through a photomask having the appropriate pattern; the photoresist could be subsequently developed to appropriately pattern the photoresist; the exposed material of the additional compensation layer 360 could be etched to appropriately pattern the additional compensation layer 360; and then the remaining photoresist could be removed. Block 1160 then transfers control to block 1165.

In block 1165, the top electrode 330 is created above the additional compensation layer 360. The top electrode 330 can be fabricated using well known technologies such as deposition, photolithography, and etch. As an example a layer of molybdenum could be deposited onto the wafer 305 and over the additional compensation layer 360 followed by the spinning of photoresist onto the wafer 305; the photoresist could be exposed through a photomask having the appropriate pattern; the photoresist could be subsequently developed to appropriately pattern the photoresist; the exposed material of the top electrode 330 could be etched to appropriately pattern the top electrode 330; and then the remaining photoresist could be removed. Block 1165 then transfers control to block 1170.

In block 1170, the sacrificial material previously deposited in the cavity 310 is removed. Should the sacrificial material be a glass, hydrofluoric acid can be used to etch it from the cavity 310. Block 1170 then terminates the process.

Should a mass load layer be included on the resonator 110, it can be fabricated prior to the process steps of block 1170 using well known technologies such as deposition, photolithography, and etch. As an example, a layer of molybdenum or other material could be deposited over the top electrode 330 onto the wafer 305 followed by the spinning of photoresist onto the wafer 305; the photoresist could be exposed through a photomask having the appropriate pattern; the photoresist could be subsequently developed to appropriately pattern the photoresist; the exposed mass load layer material could be etched to appropriately pattern the mass load layer; and then the remaining photoresist could be removed.

Figure 12A:
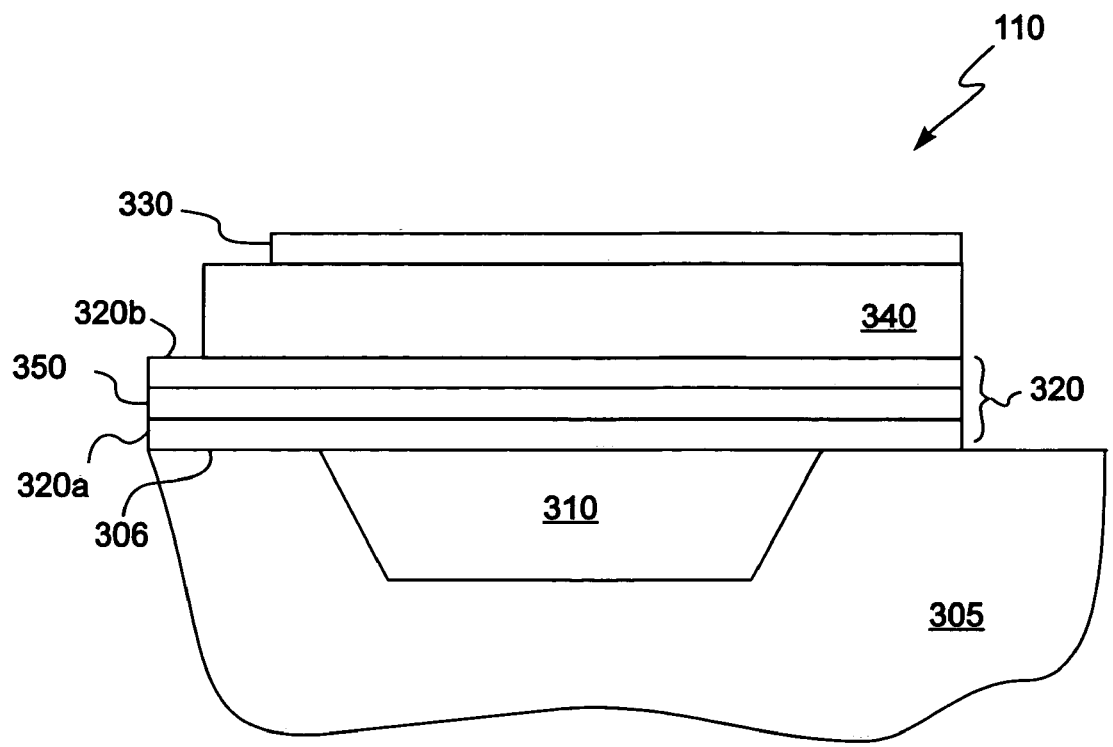
FIG. 12A is a drawing of yet another resonator as described in various representative embodiments.

FIG. 12A is a drawing of yet another resonator 110 as described in various representative embodiments. In FIG. 12A, the resonator 110 is shown in a side view and is fabricated using integrated circuit processing compatible procedures. In this example, the resonator 110 is a thin film bulk acoustic resonator (FBAR). The resonator 110 is fabricated on a substrate 305 which could be, for example, a silicon substrate 305, a silicon wafer 305, a ceramic substrate 305, or other appropriate material. Again, the resonator 110 is fabricated above the cavity 310. The cavity 310 is created on the top surface 306 of the substrate 305, and the resonator 110 is fabricated above and bridges the cavity 310. The resonator 110 includes the bottom electrode 320, the piezoelectric layer 340, and the top electrode 330. The bottom electrode 320 comprises a compensation layer 350 sandwiched between a bottom under electrode layer 320a and a bottom over electrode layer 320b. In the representative embodiment of FIG. 12A, the compensation layer 350 lies on top of the bottom under electrode layer 320a, the bottom over electrode layer 320b lies on top of the compensation layer 350, the piezoelectric layer 340 lies on top of the bottom over electrode layer 320b, and the top electrode 330 lies on top of the piezoelectric layer 340. In an alternative embodiment of FIG. 12A, the bottom under electrode layer 320a and the bottom over electrode layer 320b could extend beyond the edges of the composition layer 340 thereby totally or partially encapsulating the compensation layer 340.

In another alternative embodiment of FIG. 12A, the bottom under electrode layer 320a could be eliminated. And in still another alternative embodiment of FIG. 12A, the bottom over electrode layer 320b could be eliminated.

Figure 12B:
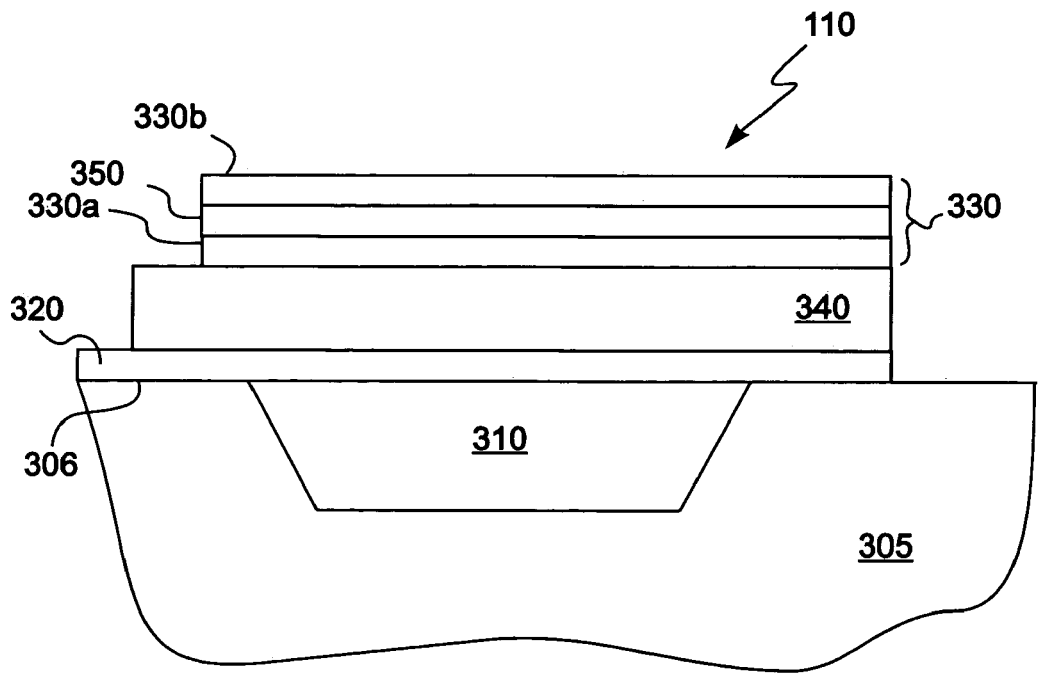
FIG. 12B is a drawing of still yet another resonator as described in various representative embodiments.

FIG. 12B is a drawing of still yet another resonator 110 as described in various representative embodiments. In FIG. 12B, the resonator 110 is shown in a side view and is fabricated using integrated circuit processing compatible procedures. In this example, the resonator 110 is a thin film bulk acoustic resonator (FBAR). The resonator 110 is fabricated on a substrate 305 which could be, for example, a silicon substrate 305, a silicon wafer 305, a ceramic substrate 305, or other appropriate material. Again, the resonator 110 is fabricated above the cavity 310. The cavity 310 is created on the top surface 306 of the substrate 305, and the resonator 110 is fabricated above and bridges the cavity 310. The resonator 110 includes the bottom electrode 320, the piezoelectric layer 340, and the top electrode 330. The top electrode 330 comprises a compensation layer 350 sandwiched between a top under electrode layer 330a and a top over electrode layer 330b. In the representative embodiment of FIG. 12B, the piezoelectric layer 340 lies on top of the bottom electrode layer 320, the top under electrode layer 330a lies on top of the piezoelectric layer 340, the compensation layer 350 lies on top of the top under electrode layer 330a, and the top over electrode layer 330b lies on top of the compensation layer 350. In an alternative embodiment of FIG. 12B, the top under electrode layer 330a and the top over electrode layer 330b could extend beyond the edges of the composition layer 340 thereby totally or partially encapsulating the compensation layer 340.

In another alternative embodiment of FIG. 12B, the top under electrode layer 330a could be eliminated. And in still another alternative embodiment of FIG. 12B, the top over electrode layer 330b could be eliminated.

Figure 13:
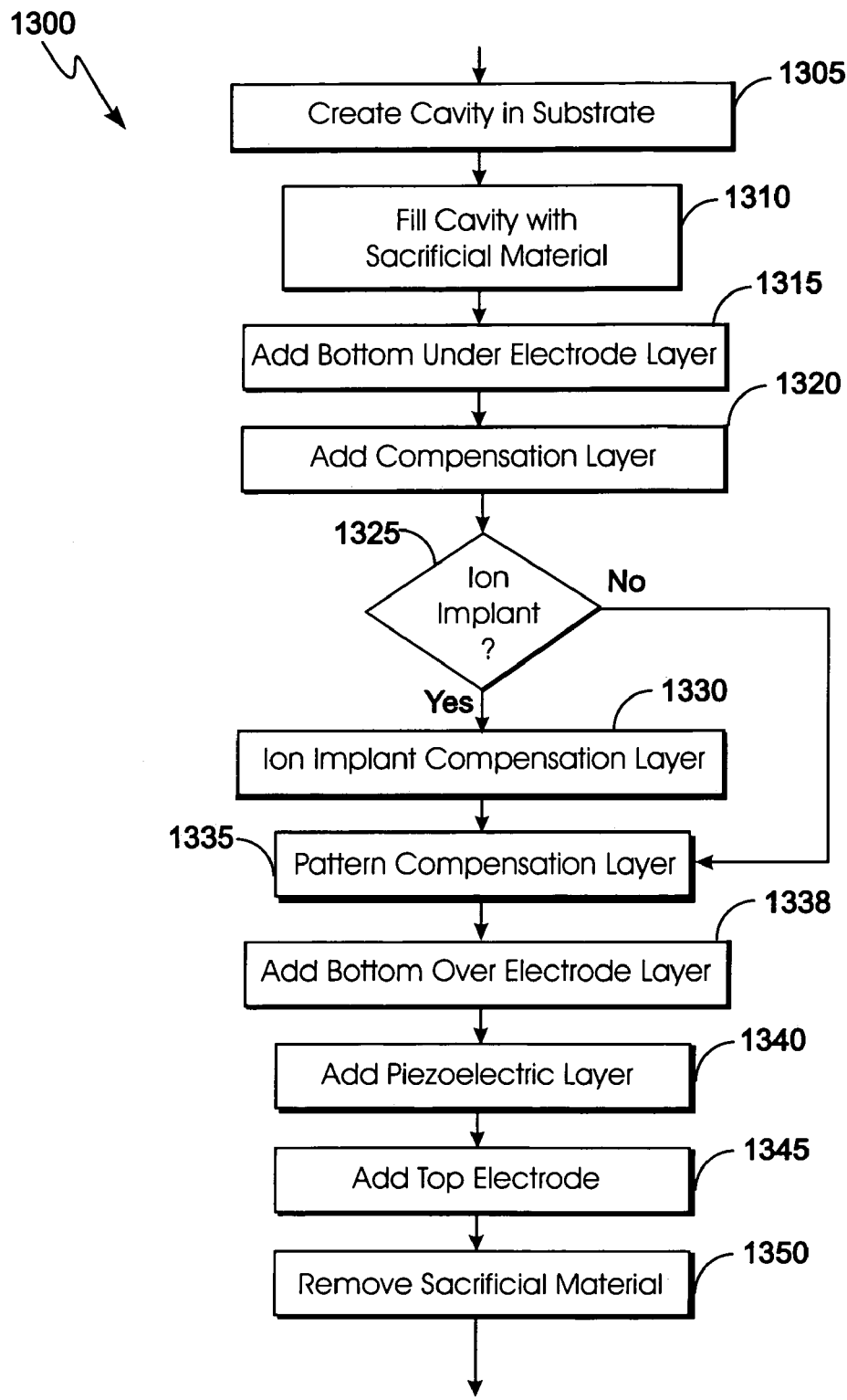
FIG. 13 is a flow chart of a method for fabricating the resonator of FIG. 12A.

FIG. 13 is a flow chart of a method 1300 for fabricating the resonator 110 of FIG. 12A. In block 1305, the cavity 310 is created in the substrate 305. The cavity 310 can be fabricated using well known technologies such as oxide formation, photolithography, and etch. As an example, a layer of silicon dioxide could be grown on a wafer 305 followed by spinning of photoresist onto the wafer 305; the photoresist could be exposed through a photomask having the appropriate pattern; the photoresist could be subsequently developed to appropriately pattern the photoresist; the exposed silicon dioxide could be etched to appropriately pattern the silicon dioxide; the remaining photoresist could be removed; and then the silicon substrate could be etched using the patterned silicon dioxide as a mask to appropriately pattern the cavity 310. Block 1305 then transfers control to block 1310.

In block 1310, the cavity 310 is filled with a sacrificial material. The sacrificial material can be removed later and could be a phosphorus silica glass material comprising approximately 8% phosphorus and approximately 92% silicon dioxide. The cavity 310 can be filled with the sacrificial material using well known technologies such as oxide deposition with subsequent surface polishing and etching to form a smooth surface. As an example, a layer of phosphorus silica glass could be deposited onto the wafer 305 followed by a mechanical polishing and chemical etching of the wafer surface to flatten and smooth the surface leaving the phosphorus silica glass in the cavity 310. Block 1310 then transfers control to block 1315.

In block 1315, the bottom under electrode layer 320a is created above the sacrificial material in the cavity 310. The bottom under electrode layer 320a can be fabricated using well known technologies such as deposition, photolithography, and etch. As an example, a layer of molybdenum could be deposited onto the wafer 305 and over the sacrificial material in the cavity 310 followed by the spinning of photoresist onto the wafer 305; the photoresist could be exposed through a photomask having the appropriate pattern; the photoresist could be subsequently developed to appropriately pattern the photoresist; the exposed material of the bottom under electrode layer 320a could be etched to appropriately pattern the bottom under electrode layer 320a;

and then the remaining photoresist could be removed. Block 1315 then transfers control to block 1320.

In block 1320, the compensation layer 350 is added on top of the bottom under electrode layer 320a of the resonator 110. The compensation layer 350 can be added using well known technologies such as deposition. As an example, in a representative embodiment, a layer of borosilicate glass could be deposited onto the wafer 305 and over the bottom under electrode layer 320a, and in another representative embodiment, a layer of silicon dioxide which will later receive an ion implant 377 of boron could be deposited onto the wafer 305 and over the bottom under electrode layer 320a. Block 1320 then transfers control to block 1325.

If the compensation layer 350 is to be ion implanted, block 1325 transfers control to block 1330. Otherwise block 1325 transfers control to block 1335.

In block 1330, the compensation layer 350 receives an ion implant 377. This ion implant could be, for example, boron atoms implanted into the compensation layer 350 at an energy of 30 keV and a dose of $2.5 \times 10^{15}$ atoms per square centimeter. Block 1330 then transfers control to block 1335.

In block 1335, the compensation layer 350 is patterned. The compensation layer 350 can be patterned using well known technologies such as photolithography and etch. As an example, in a representative embodiment, photoresist is spun onto the wafer 305; the photoresist could be exposed through a photomask having the appropriate pattern; the photoresist could be subsequently developed to appropriately pattern the photoresist; the exposed material of the compensation layer 350 could be etched to appropriately pattern the compensation layer 350; and then the remaining photoresist could be removed. Block 1335 then transfers control to block 1338.

In block 1338, the bottom over electrode layer 320b is created above the compensation layer 350. The bottom over electrode layer 320b can be fabricated using well known technologies such as deposition, photolithography, and etch. As an example, a layer of molybdenum could be deposited onto the wafer 305 and over the compensation layer 350 followed by the spinning of photoresist onto the wafer 305; the photoresist could be exposed through a photomask having the appropriate pattern; the photoresist could be subsequently developed to appropriately pattern the photoresist; the exposed material of the bottom over electrode layer 320b could be etched to appropriately pattern the bottom over electrode layer 320b; and then the remaining photoresist could be removed. Block 1338 then transfers control to block 1340.

In block 1340, the piezoelectric layer 340 is created above the bottom over electrode layer 320b. The piezoelectric layer 340 can be fabricated using well known technologies such as deposition, photolithography, and etch. As an example, a layer of aluminum nitride could be deposited onto the wafer 305 and over the bottom over electrode layer 320b followed by the spinning of photoresist onto the wafer 305; the photoresist could be exposed through a photomask having the appropriate pattern; the photoresist could be subsequently developed to appropriately pattern the photoresist; the exposed material of the piezoelectric layer 340 could be etched to appropriately pattern the piezoelectric layer 340; and then the remaining photoresist could be removed. Block 1340 then transfers control to block 1345.

In block 1345, the top electrode 330 is created above the piezoelectric layer 340. The top electrode 330 can be fabricated using well known technologies such as deposition, photolithography, and etch. As an example a layer of molybdenum could be deposited onto the wafer 305 and over the piezoelectric layer 340 followed by the spinning of photoresist onto the wafer 305; the photoresist could be exposed through a photomask having the appropriate pattern; the photoresist could be subsequently developed to appropriately pattern the photoresist; the exposed material of the top electrode 330 could be etched to appropriately pattern the top electrode 330; and then the remaining photoresist could be removed. Block 1345 then transfers control to block 1350.

In block 1350, the sacrificial material previously deposited in the cavity 310 is removed. Should the sacrificial material be phosphorus silica glass, hydrofluoric acid can be used to etch it from the cavity 310. Block 1350 then terminates the process.

Should a mass load layer be included on the resonator 110, it can be fabricated prior to the process steps of block 1350 using well known technologies such as deposition, photolithography, and etch. As an example, a layer of molybdenum or other material could be deposited onto the wafer 305 and over the top electrode 330 followed by the spinning of photoresist onto the wafer 305; the photoresist could be exposed through a photomask having the appropriate pattern; the photoresist could be subsequently developed to appropriately pattern the photoresist; the exposed mass load layer material could be etched to appropriately pattern the mass load layer; and then the remaining photoresist could be removed.

As will be known to one skilled in the art, in other representative embodiments, various changes can be made to the above described processes to effect similar structures to those just described.

Figure 14:
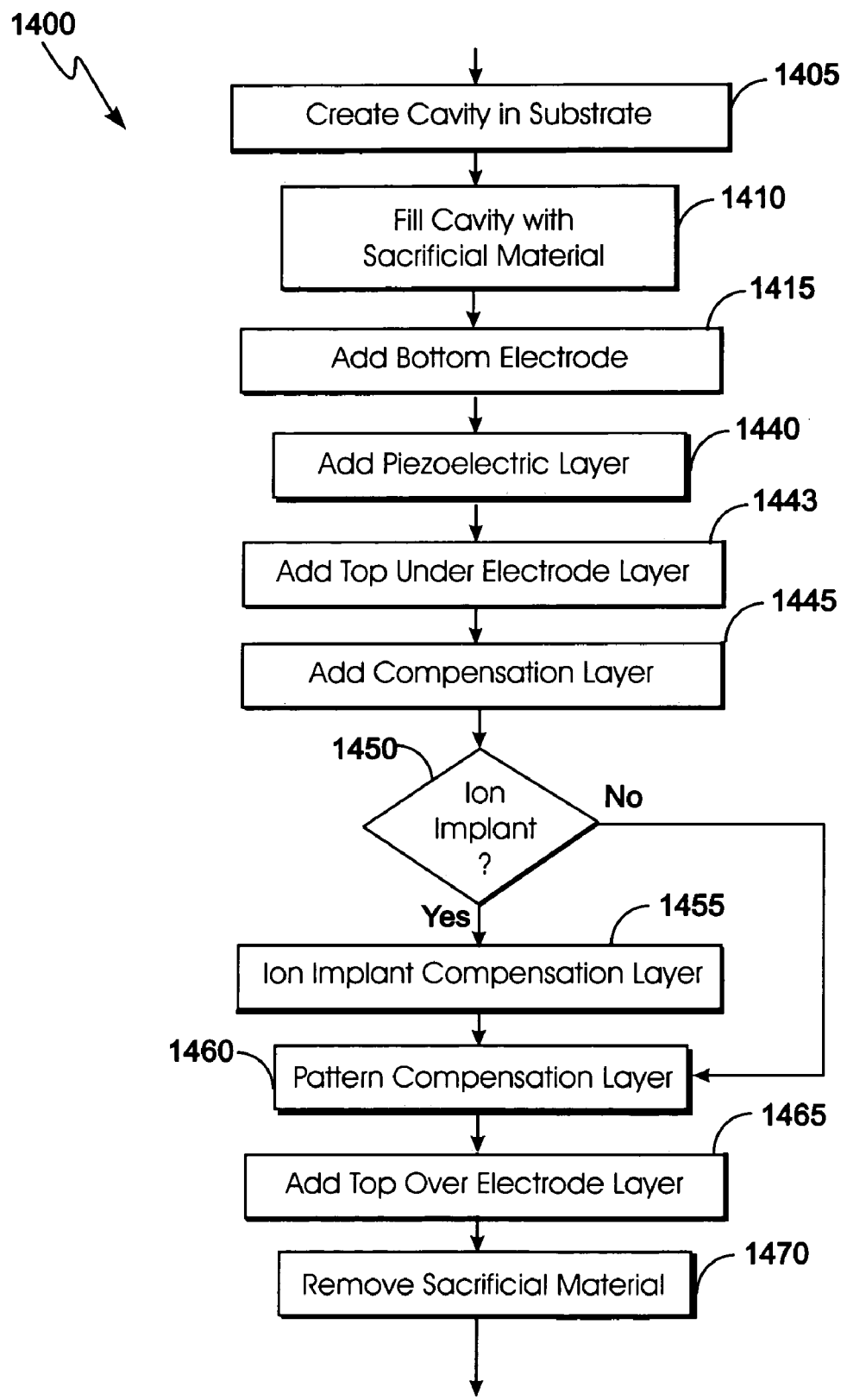
FIG. 14 is a flow chart of a method for fabricating the resonator of FIG. 12B.

FIG. 14 is a flow chart of a method 1400 for fabricating the resonator 110 of FIG. 12B. In block 1405, the cavity 310 is created in the substrate 305. The cavity 310 can be fabricated using well known technologies such as oxide formation, photolithography, and etch. As an example, a layer of silicon dioxide could be grown on a wafer 305 followed by the spinning of photoresist onto the wafer 305; the photoresist could be exposed through a photomask having the appropriate pattern; the photoresist could be subsequently developed to appropriately pattern the photoresist; the exposed silicon dioxide could be etched to appropriately pattern the silicon dioxide; the remaining photoresist could be removed; and then the silicon substrate could be etched using the patterned silicon dioxide as a mask to appropriately pattern the cavity 310. Block 1405 then transfers control to block 1410.

In block 1410, the cavity 310 is filled with a sacrificial material. The sacrificial material can be removed later and could be a phosphorus silica glass material comprising approximately 8% phosphorus and approximately 92% silicon dioxide. The cavity 310 can be filled with the sacrificial material using well known technologies such as oxide deposition with subsequent surface polishing and etching to form a smooth surface. As an example, a layer of phosphorus silica glass could be deposited onto the wafer 305 followed by a mechanical polishing and chemical etching of the wafer surface to flatten and smooth the surface leaving the phosphorus silica glass in the cavity 310. Block 1410 then transfers control to block 1415.

In block 1415, the bottom electrode 320 is created above the sacrificial material in the cavity 310. The bottom electrode 320 can be fabricated using well known technologies such as deposition, photolithography, and etch. As an example, a layer of molybdenum could be deposited over the sacrificial material in the cavity 310 onto the wafer 305 followed by the spinning of photoresist onto the wafer 305;

the photoresist could be exposed through a photomask having the appropriate pattern; the photoresist could be subsequently developed to appropriately pattern the photoresist; the exposed material of the bottom electrode 320 could be etched to appropriately pattern the bottom electrode 320; and then the remaining photoresist could be removed. Block 1415 then transfers control to block 1440.

In block 1440, the piezoelectric layer 340 is created above the bottom electrode 320. The piezoelectric layer 340 can be fabricated using well known technologies such as deposition, photolithography, and etch. As an example, a layer of aluminum nitride could be deposited onto the wafer 305 and over the bottom electrode 320 followed by the spinning of photoresist onto the wafer 305; the photoresist could be exposed through a photomask having the appropriate pattern; the photoresist could be subsequently developed to appropriately pattern the photoresist; the exposed material of the piezoelectric layer 340 could be etched to appropriately pattern the piezoelectric layer 340; and then the remaining photoresist could be removed. Block 1440 then transfers control to block 1143.

In block 1443, the top under electrode layer 330*a* is created above the piezoelectric layer 340. The top under electrode layer 330*a* can be fabricated using well known technologies such as deposition, photolithography, and etch. As an example a layer of molybdenum could be deposited onto the wafer 305 and over the piezoelectric layer 340 followed by the spinning of photoresist onto the wafer 305; the photoresist could be exposed through a photomask having the appropriate pattern; the photoresist could be subsequently developed to appropriately pattern the photoresist; the exposed material of the top under electrode layer 330*a* could be etched to appropriately pattern the top under electrode layer 330*a*; and then the remaining photoresist could be removed. Block 1443 then transfers control to block 1445.

In block 1445, the compensation layer 350 is added on top of the top under electrode layer 330*a* of the resonator 110. The compensation layer 350 can be added using well known technologies such as deposition. As an example, in a representative embodiment, a layer of borosilicate glass could be deposited onto the wafer 305 and over the top under electrode layer 330*a*, and in another representative embodiment, a layer of silicon dioxide which will later receive an ion implant 377 of boron could be deposited onto the wafer 305 and over the top under electrode layer 330*a*. Block 1445 then transfers control to block 1450.

If the compensation layer 350 is to be ion implanted, block 1450 transfers control to block 1455. Otherwise block 1450 transfers control to block 1460.

In block 1455, the compensation layer 350 receives an ion implant 377. This ion implant could be, for example, boron atoms implanted into the compensation layer 350 at an energy of 30 keV and a dose of $2.5 \times 10^{15}$ atoms per square centimeter. Block 1455 then transfers control to block 1460.

In block 1460, the compensation layer 350 is patterned. The compensation layer 350 can be patterned using well known technologies such as photolithography and etch. As an example, in a representative embodiment, photoresist is spun onto the wafer 305; the photoresist could be exposed through a photomask having the appropriate pattern; the photoresist could be subsequently developed to appropriately pattern the photoresist; the exposed material of the compensation layer 350 could be etched to appropriately pattern the compensation layer 350; and then the remaining photoresist could be removed. Block 1460 then transfers control to block 1465.

In block 1465, the top over electrode layer 330*b* is created above the compensation layer 350. The top over electrode layer 330*b* can be fabricated using well known technologies such as deposition, photolithography, and etch. As an example a layer of molybdenum could be deposited onto the wafer 305 and over the compensation layer 350 followed by the spinning of photoresist onto the wafer 305; the photoresist could be exposed through a photomask having the appropriate pattern; the photoresist could be subsequently developed to appropriately pattern the photoresist; the exposed material of the top over electrode layer 330*b* could be etched to appropriately pattern the top over electrode layer 330*b*; and then the remaining photoresist could be removed. Block 1465 then transfers control to block 1470.

In block 1470, the sacrificial material previously deposited in the cavity 310 is removed. Should the sacrificial material be a glass, hydrofluoric acid can be used to etch it from the cavity 310. Block 1470 then terminates the process.

Should a mass load layer be included on the resonator 110, it can be fabricated prior to the process steps of block 1470 using well known technologies such as deposition, photolithography, and etch. As an example, a layer of molybdenum or other material could be deposited over the top electrode 330 onto the wafer 305 followed by the spinning of photoresist onto the wafer 305; the photoresist could be exposed through a photomask having the appropriate pattern; the photoresist could be subsequently developed to appropriately pattern the photoresist; the exposed mass load layer material could be etched to appropriately pattern the mass load layer; and then the remaining photoresist could be removed.

As will be known to one skilled in the art, in other representative embodiments, various changes can be made to the above described processes to effect similar structures to those just described.

The representative embodiments, which have been described in detail herein, have been presented by way of example and not by way of limitation. It will be understood by those skilled in the art that various changes may be made in the form and details of the described embodiments resulting in equivalent embodiments that remain within the scope of the appended claims.

What is claimed is:

1. A resonator, comprising:
   a bottom electrode overlaying at least part of a substrate;
   a composite structure overlaying at least part of the bottom electrode, wherein the composite structure comprises a piezoelectric layer and a compensation layer and wherein the compensation layer comprises silicon dioxide combined with boron; and
   a top electrode overlaying at least part of the composite structure.

2. The resonator as recited in claim 1, wherein the silicon dioxide combined with boron comprising the compensation layer comprises silicon dioxide ion implanted with boron.

3. The resonator as recited in claim 1, wherein the silicon dioxide combined with boron comprising the compensation layer comprises borosilicate glass.

4. The resonator as recited in claim 1, wherein the piezoelectric layer overlays at least part of the bottom electrode and wherein the compensation layer overlays at least part of the piezoelectric layer.

5. The resonator as recited in claim 1, wherein the compensation layer overlays at least part of the bottom electrode and wherein the piezoelectric layer overlays at least part of the compensation layer.

6. The resonator as recited in claim 1, wherein the composite structure further comprises an additional compensation layer, wherein the compensation layer overlays at least part of the bottom electrode, wherein the piezoelectric layer overlays at least part of the compensation layer, and wherein the additional compensation layer overlays at least part of the piezoelectric layer.

7. The resonator as recited in claim 1, wherein the bottom electrode overlays a cavity created in the substrate and wherein the cavity is devoid of sacrificial material.

8. A resonator, comprising:
  a bottom electrode overlaying at least part of a substrate, wherein the bottom electrode comprises a bottom under electrode layer, a compensation layer, and a bottom over electrode layer and wherein the compensation layer comprises silicon dioxide combined with boron;
  a piezoelectric layer overlaying at least part of the bottom electrode; and
  a top electrode overlaying at least part of the piezoelectric layer.

9. The resonator as recited in claim 8, wherein the silicon dioxide combined with boron comprising the compensation layer comprises silicon dioxide ion implanted with boron.

10. The resonator as recited in claim 8, wherein the silicon dioxide combined with boron comprising the compensation layer comprises borosilicate glass.

11. A resonator, comprising:
  a bottom electrode overlaying at least part of a substrate;
  a piezoelectric layer overlaying at least part of the bottom electrode; and
  a top electrode overlaying at least part of the piezoelectric layer, wherein the top electrode comprises a top under electrode layer, a compensation layer, and a top over electrode layer and wherein the compensation layer comprises silicon dioxide combined with boron.

12. The resonator as recited in claim 11, wherein the silicon dioxide combined with boron comprising the compensation layer comprises silicon dioxide ion implanted with boron.

13. The resonator as recited in claim 11, wherein the silicon dioxide combined with boron comprising the compensation layer comprises borosilicate glass.

* * * * *